US012796254B2

(12) United States Patent
Byun et al.

(10) Patent No.: US 12,796,254 B2
(45) Date of Patent: Nov. 10, 2026

(54) DISPLAY APPARATUS

(71) Applicant: Samsung Display Co., LTD., Yongin-si (KR)

(72) Inventors: Minwoo Byun, Yongin-si (KR); Hyunae Park, Yongin-si (KR); Jaewon Cho, Yongin-si (KR); Minjoo Kim, Yongin-si (KR); Donghwan Jeon, Yongin-si (KR); Seoni Jeong, Yongin-si (KR); Sungchan Hwang, Yongin-si (KR)

(73) Assignee: SAMSUNG DISPLAY CO., LTD., Gyeonggi-Do (KR)

( * ) Notice: Subject to any disclaimer, the term of this patent is extended or adjusted under 35 U.S.C. 154(b) by 0 days.

(21) Appl. No.: 18/807,312

(22) Filed: Aug. 16, 2024

(65) Prior Publication Data

US 2025/0126996 A1 Apr. 17, 2025

(30) Foreign Application Priority Data

Oct. 12, 2023 (KR) ........................ 10-2023-0136225
Nov. 15, 2023 (KR) ........................ 10-2023-0158627

(51) Int. Cl.
*H10K 59/131* (2023.01)
*G09G 3/3233* (2016.01)
(Continued)

(52) U.S. Cl.
CPC ......... *H10K 59/131* (2023.02); *G09G 3/3233* (2013.01); *H10K 59/126* (2023.02);
(Continued)

(58) Field of Classification Search
CPC ............. H10K 59/1213; H10K 59/123; H10K 59/131; H10K 59/12; H10K 59/353;
(Continued)

(56) References Cited

U.S. PATENT DOCUMENTS 6,320,204 B1 * 11/2001 Hirabayashi .......... G02F 1/1368 257/E29.151
10,103,342 B2 10/2018 Lee et al.
(Continued)

FOREIGN PATENT DOCUMENTS

CN 110992880 B 4/2021
CN 115605998 A 1/2023
(Continued)

*Primary Examiner* — Nitin Patel
*Assistant Examiner* — Amen W Bogale
(74) *Attorney, Agent, or Firm* — CANTOR COLBURN LLP

(57) ABSTRACT

A display apparatus including pixels arranged in a display area includes a first conductive layer including a first voltage line, a second conductive layer disposed on the first conductive layer and including a first conductive pattern overlapping the first voltage line, a semiconductor layer disposed on the second conductive layer and including a first semiconductor pattern overlapping the first conductive pattern, a third conductive layer disposed on the semiconductor layer and including a second conductive pattern overlapping the first conductive pattern, and a fourth conductive layer disposed on the third conductive layer and including a data line and a third conductive pattern overlapping the second conductive pattern, wherein the first voltage line includes a body portion extending in a first direction and a shielding portion extending from the body portion in a second direction to overlap the data line, wherein the second direction crosses the first direction.

16 Claims, 28 Drawing Sheets

(51) Int. Cl.
*H10K 59/126* (2023.01)
*H10K 59/35* (2023.01)
*H10K 59/80* (2023.01)

(52) U.S. Cl.
CPC ................. *H10K 59/80522* (2023.02); *G09G 2300/0819* (2013.01); *G09G 2300/0852* (2013.01); *G09G 2300/0861* (2013.01); *G09G 2310/08* (2013.01); *G09G 2320/0209* (2013.01); *G09G 2320/0233* (2013.01); *G09G 2320/0242* (2013.01); *H10K 59/352* (2023.02); *H10K 59/353* (2023.02)

(58) Field of Classification Search
CPC .. H10K 59/126; H10K 59/1216; H10K 59/12; H10K 59/352; H10K 59/80522; H10D 30/6723; G09G 3/3233; G09G 2300/0819; G09G 2300/0465; G09G 2300/0426; G09G 2300/0842; G09G 2300/0861; G09G 2320/0209; G09G 2300/0852; G09G 2310/08; G09G 2320/0233; G09G 2320/0242
See application file for complete search history.

(56) References Cited

U.S. PATENT DOCUMENTS

| | | | | |
|---|---|---|---|---|
| 10,978,536 | B2 | 4/2021 | Park et al. | |
| 11,004,381 | B2 * | 5/2021 | Ren | G09G 3/2074 |
| 11,054,706 | B2 | 7/2021 | Lee et al. | |
| 11,322,065 | B2 | 5/2022 | Kim et al. | |
| 11,469,291 | B2 | 10/2022 | Diao et al. | |
| 11,715,418 | B2 | 8/2023 | An et al. | |
| 11,839,110 | B2 * | 12/2023 | Lee | H10D 86/423 |
| 11,910,669 | B2 * | 2/2024 | Liao | G09G 3/3233 |
| 12,256,614 | B2 * | 3/2025 | Bang | H10D 86/441 |
| 12,324,310 | B2 * | 6/2025 | Choi | G09G 3/3233 |
| 2002/0060756 | A1 * | 5/2002 | Kurashina | G02F 1/136213 349/39 |
| 2016/0109773 | A1 * | 4/2016 | Lee | G02F 1/133345 349/138 |
| 2016/0274428 | A1 * | 9/2016 | Kim | G02F 1/136209 |
| 2017/0235200 | A1 * | 8/2017 | Chong | G02F 1/134309 257/59 |
| 2017/0317155 | A1 * | 11/2017 | Oh | H10D 1/692 |
| 2018/0331124 | A1 * | 11/2018 | Cho | G09G 3/3233 |
| 2020/0312890 | A1 * | 10/2020 | Oikawa | H10D 30/6723 |
| 2021/0028258 | A1 * | 1/2021 | Lee | H10D 86/421 |
| 2021/0111239 | A1 * | 4/2021 | Cho | H10D 30/6745 |
| 2021/0143241 | A1 * | 5/2021 | Kim | H10D 86/441 |
| 2021/0234119 | A1 * | 7/2021 | Moon | H10K 59/122 |
| 2021/0265437 | A1 * | 8/2021 | Son | H10D 86/423 |
| 2021/0273035 | A1 * | 9/2021 | Cho | H10K 59/131 |
| 2021/0280140 | A1 * | 9/2021 | Lee | G09G 3/3291 |
| 2021/0327987 | A1 * | 10/2021 | Fang | H10D 86/481 |
| 2021/0376037 | A1 * | 12/2021 | You | H10K 59/124 |
| 2022/0130913 | A1 * | 4/2022 | Long | H04M 1/02 |
| 2022/0156477 | A1 * | 5/2022 | Lee | G06V 40/1318 |
| 2022/0165980 | A1 * | 5/2022 | Shim | H10K 59/12 |
| 2022/0181354 | A1 * | 6/2022 | Lee | G09G 3/3258 |
| 2022/0285468 | A1 * | 9/2022 | Jeong | H10K 59/1213 |
| 2022/0293051 | A1 * | 9/2022 | Liu | G09G 3/3225 |
| 2022/0328592 | A1 * | 10/2022 | You | G09G 3/3241 |
| 2023/0081342 | A1 | 3/2023 | Lin et al. | |
| 2023/0189593 | A1 * | 6/2023 | Bang | H10D 86/441 |
| 2023/0209901 | A1 * | 6/2023 | Lhee | H10K 59/126 257/40 |
| 2023/0389370 | A1 * | 11/2023 | Ozeki | H10K 59/126 |
| 2024/0032384 | A1 * | 1/2024 | Zeng | H10K 59/1315 |
| 2024/0045295 | A1 * | 2/2024 | Ozeki | G02F 1/13606 |
| 2024/0057461 | A1 * | 2/2024 | Zhao | H10K 59/131 |
| 2024/0233639 | A9 | 7/2024 | Byun et al. | |
| 2024/0315075 | A1 * | 9/2024 | Wan | H10K 59/121 |
| 2024/0381709 | A1 * | 11/2024 | Ding | H10K 59/1201 |
| 2024/0423043 | A1 * | 12/2024 | Jo | G09G 3/3688 |

FOREIGN PATENT DOCUMENTS

| | | | |
|---|---|---|---|
| CN | 117935735 | A | 4/2024 |
| KR | 1020200036975 | A | 4/2020 |
| KR | 10-20200070512 | A | 6/2020 |
| KR | 20200123314 | A | 10/2020 |
| KR | 102289838 | B1 | 8/2021 |
| KR | 1020210142055 | A | 11/2021 |
| KR | 1020220106037 | A | 7/2022 |
| KR | 102567200 | B1 | 8/2023 |
| KR | 10-2024-0060411 | A | 5/2024 |

* cited by examiner

DISPLAY APPARATUS

This application claims priority to Korean Patent Application No. 10-2023-0136225, filed on Oct. 12, 2023, and Korean Patent Application No. 10-2023-0158627, filed on Nov. 15, 2023, and all the benefits accruing therefrom under 35 U.S.C. § 119, the contents of which in their entirety are herein incorporated by reference.

BACKGROUND

1. Field

The invention relates to a display apparatus, and more particularly to a display apparatus having improved display quality.

2. Description of the Related Art

Currently, the usage of display apparatuses has diversified. Moreover, display apparatuses have become thinner and lighter, and thus, the usage thereof has expanded.

As display apparatuses are being used for various purposes, there are various methods of designing the shapes of display apparatuses, and functions which may be connected to or associated with display apparatuses have increased.

SUMMARY

One or more embodiments include a display apparatus having improved display quality.

Additional aspects will be set forth in part in the description which follows and, in part, will be apparent from the description, or may be learned by practice of the presented embodiments of the invention.

According to one or more embodiments, a display apparatus including pixels arranged in a display area includes a first conductive layer including a first voltage line, a second conductive layer disposed on the first conductive layer and including a first conductive pattern overlapping the first voltage line, a semiconductor layer disposed on the second conductive layer and including a first semiconductor pattern overlapping the first conductive pattern, a third conductive layer disposed on the semiconductor layer and including a second conductive pattern overlapping the first conductive pattern, and a fourth conductive layer disposed on the third conductive layer and including a data line and a third conductive pattern overlapping the second conductive pattern, wherein the first voltage line includes a body portion extending in a first direction and a shielding portion extending from the body portion in a second direction to overlap the data line, the second direction crossing the first direction.

In an embodiment, the third conductive layer may further include a first connection electrode, and the fourth conductive layer may further include a second connection electrode, wherein the shielding portion may be electrically connected to the first semiconductor pattern through the first connection electrode and the second connection electrode.

In an embodiment, the shielding portion may be spaced apart from the first semiconductor pattern in a plan view.

In an embodiment, the first conductive layer may further include a fourth conductive pattern overlapping the second conductive pattern, wherein the second conductive pattern may be electrically connected to the fourth conductive pattern, and the first conductive pattern may be electrically connected to the third conductive pattern.

In an embodiment, the data line may include a first data line, a second data line, and a third data line, and the shielding portion may include a first shielding portion overlapping the first data line, a second shielding portion overlapping the second data line, and a third shielding portion overlapping the third data line, wherein the first shielding portion, the second shielding portion, and the third shielding portion may have a same area.

In an embodiment, the data line may include a first data line, a second data line, and a third data line, and the shielding portion may include a first shielding portion overlapping the first data line, a second shielding portion overlapping the second data line, and a third shielding portion overlapping the third data line, wherein an area of the first shielding portion may be different from an area of the second shielding portion and an area of the third shielding portion.

In an embodiment, the pixels may include a red pixel that emits red light, a blue pixel that emits blue light, and a green pixel that emits green light, wherein the first data line may be electrically connected to the red pixel.

In an embodiment, the first conductive layer may further include a second voltage line extending in the first direction, and the semiconductor layer may further include a second semiconductor pattern electrically connected between the data line and the second voltage line.

In an embodiment, the third conductive layer may further include a first gate line overlapping the first semiconductor pattern and configured to transmit a first gate signal, and a second gate line overlapping the second semiconductor pattern and configured to transmit a second gate signal, and the pixel may operate in a non-emission period and an emission period during one frame period, wherein, in the non-emission period, after the second gate signal changes to an on-voltage, the first gate signal may change to an on-voltage, and the second gate signal changes to an off-voltage, the first gate signal may change to an off-voltage.

In an embodiment, during an on-voltage period of the second gate signal, a reference voltage may be transmitted through the second voltage line to the second conductive pattern.

In an embodiment, the display apparatus may further include a fifth conductive layer disposed on the fourth conductive layer and including a third voltage line extending in the second direction and overlapping the data line.

In an embodiment, the display apparatus may further include a voltage supply line disposed in a peripheral area outside the display area and extending in the first direction, wherein the third voltage line may cross the display area and be connected to the voltage supply line in the peripheral area.

In an embodiment, the pixel may include a display element including a pixel electrode, an opposite electrode, and an intermediate layer between the pixel electrode and the opposite electrode, wherein a voltage supplied to the third voltage line may be equal to a voltage supplied to the opposite electrode.

In an embodiment, the pixel may include a display element including a pixel electrode, an opposite electrode, and an intermediate layer between the pixel electrode and the opposite electrode, wherein a voltage supplied to the third voltage line may be different from a voltage supplied to the opposite electrode.

In an embodiment, the display apparatus may further include a fifth conductive layer disposed on the fourth conductive layer and including a fourth voltage line extending in the second direction and a sixth conductive layer disposed on the fifth conductive layer and including pixel electrodes, auxiliary electrodes, and fifth voltage lines extending in the first direction and connecting neighboring auxiliary electrodes among the auxiliary electrodes.

In an embodiment, the display apparatus may further include a pixel-defining layer disposed on the sixth conductive layer and defining pixel openings and auxiliary openings, wherein each of the pixel openings may overlap one of the pixel electrodes, and each of the auxiliary openings may overlap one of auxiliary electrodes, which overlap the fourth voltage line, from among the auxiliary electrodes.

According to one or more embodiments, a display apparatus includes a first pixel circuit electrically connected to a first light-emitting diode and a second pixel circuit electrically connected to a second light-emitting diode, wherein each of the first pixel circuit and the second pixel circuit includes a first voltage line extending in a first direction, a data line disposed on the first voltage line and extending in a second direction crossing the first direction, a capacitor including a first capacitor electrode and a second capacitor electrode disposed on the first capacitor electrode, a first transistor electrically connected between the first voltage line and the capacitor, a second transistor electrically connected to the data line and a gate electrode of the first transistor, a third transistor electrically connected to a second voltage line extending in the first direction and the gate electrode of the first transistor, and a fourth transistor electrically connected between the first voltage line and the first transistor, wherein the first voltage line includes a body portion and a shielding portion extending from the body portion in the second direction to overlap the data line.

In an embodiment, an area of the shielding portion of the first pixel circuit may be less than an area of the shielding portion of the second pixel circuit.

In an embodiment, the first light-emitting diode may emit red light.

In an embodiment, the first voltage line and the second voltage line may be disposed in a same layer.

In an embodiment, each frame period of the first pixel circuit and the second pixel circuit may include a non-emission period and an emission period, wherein the non-emission period may include a first period in which the third transistor and the fourth transistor are turned on before a write period in which a data signal is supplied from the data line, and a second period in which the fourth transistor remains turned on after the third transistor is turned off.

In an embodiment, each of the first light-emitting diode and the second light-emitting diode may include a pixel electrode, an opposite electrode, and an intermediate layer between the pixel electrode and the opposite electrode, and the display apparatus may further include auxiliary electrodes located in a same layer as the pixel electrode, and a third voltage line connecting the auxiliary electrodes to each other and extending in the first direction.

In an embodiment, the display apparatus may further include a fourth voltage line disposed between the data line and the pixel electrode and extending in the second direction, wherein, among the auxiliary electrodes, an auxiliary electrode overlapping the fourth voltage line may be electrically connected to the third voltage line.

In an embodiment, the auxiliary electrode overlapping the fourth voltage line may be in direct contact with the opposite electrode.

In an embodiment, the display apparatus may further include a fifth voltage line located in a same layer as the fourth voltage line and overlapping the data line, wherein the fifth voltage line may be spaced apart from the third voltage line by at least one insulating layer.

Other aspects, features, and advantages than those described above will become apparent from the detailed description of the invention.

BRIEF DESCRIPTION OF THE DRAWINGS

The above and other aspects, features, and advantages of embodiments of the invention will be more apparent from the following description taken in conjunction with the accompanying drawings, in which.

DETAILED DESCRIPTION

Figure 1:
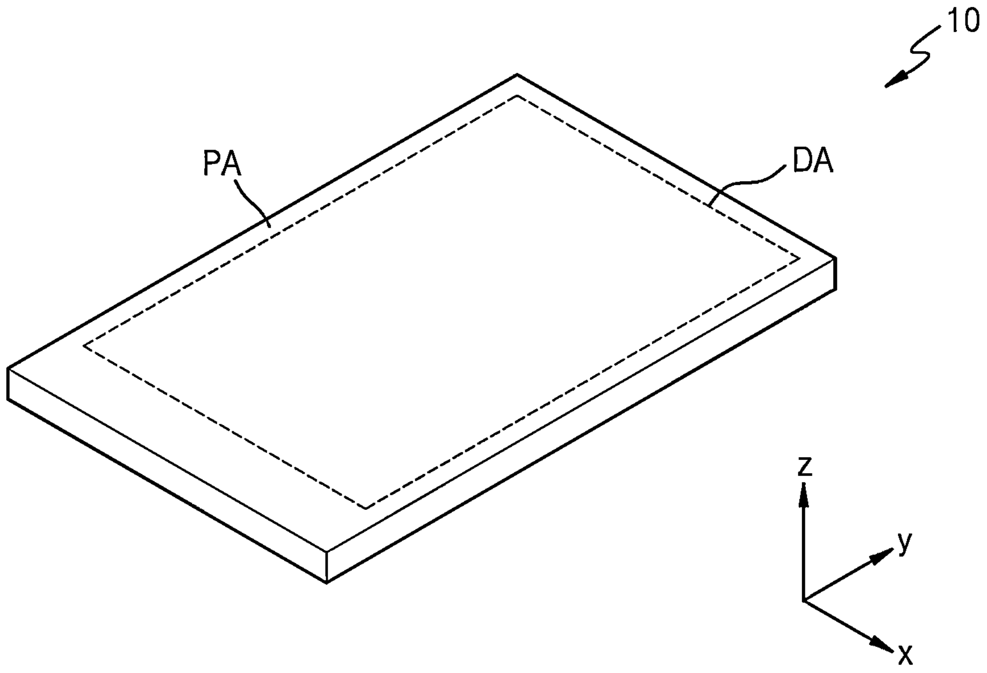
FIG. 1 is a diagram schematically showing a display apparatus, according to an embodiment.

Reference will now be made in detail to embodiments, examples of which are illustrated in the accompanying drawings, wherein like reference numerals refer to like elements throughout. In this regard, the invention may have different forms and should not be construed as being limited to the descriptions set forth herein. Accordingly, the embodiments are merely described below, by referring to the figures, to explain aspects of the invention. As used herein, the term "and/or" includes any and all combinations of one or more of the associated listed items. Throughout the disclosure, the expression "at least one of a, b or c" indicates only a, only b, only c, both a and b, both a and c, both b and c, all of a, b, and c, or variations thereof.

Various modifications may be applied to the invention, and particular embodiments will be illustrated in the drawings and described in the detailed description section. The effect and features of the invention, and a method to achieve the same, will be clearer referring to the detailed descriptions below with the drawings. However, the invention may be implemented in various forms, not by being limited to the embodiments presented below.

Hereinafter, embodiments will be described in detail with reference to the accompanying drawings, and in the description with reference to the drawings, the same or corresponding constituents are indicated by the same reference numerals and redundant descriptions thereof are omitted.

In the present specification, it will be understood that although the terms "first," "second," etc. may be used herein to describe various components, these components should not be limited by these terms. These terms are only used to distinguish one component from another.

In the present specification, as used herein, the singular forms are intended to include the plural forms as well, unless the context clearly indicates otherwise.

In the present specification, it will be further understood that the terms "include", "comprise", and/or "have" used herein specify the presence of stated features or components, but do not preclude the presence or addition of one or more other features or components.

In the present specification, it will be understood that when a layer, region, or component is referred to as being "formed on" another layer, region, or component, it can be directly or indirectly formed on the other layer, region, or component. That is, for example, intervening layers, regions, or components may be present.

In the present specification, "in a plan view" means that an objective portion is viewed from above, and "in a cross-sectional view" means that a cross-section of an objective portion taken vertically is viewed from a lateral side.

In the present specification, the fact that a first component "overlaps" a second component means that the first component is located above or below the second component and overlaps at least a portion thereof in a plan view. Sizes of components in the drawings may be exaggerated for convenience of explanation. For example, since sizes and thicknesses of components in the drawings are arbitrarily illustrated for convenience of explanation, the invention is not limited thereto.

In the present specification, the expression "A and/or B" may indicate A, B, or A and B. Also, in the present specification, the expression "at least one of A and B" may indicate A, B, or A and B.

In the present specification, when X and Y are connected, it may include a case in which X and Y are functionally connected, a case in which X and Y are directly connected, and a case in which another component is interposed between X and Y and thus X and Y are indirectly connected. Here, X and Y may be objects (e.g., devices, elements, circuits, lines, electrodes, terminals, conductive films, layers, or the like). For example, when X and Y are electrically connected, it may include a case in which X and Y are directly electrically connected, and/or a case in which another component is interposed between X and Y and thus X and Y are indirectly connected. For example, when X and Y are indirectly electrically connected, it may include a case in which one or more elements (e.g., switches, transistors, capacitors, inductors, resistors, diodes, etc.) enabling electrical connection between X and Y are connected between X and Y. Accordingly, a connection relationship is not limited to, for example, a connection relationship indicated in the drawings or the detailed description, and may include a connection relationship other than the connection relationship indicated in the drawings or the detailed description.

In the present specification, "ON" used in association with a state of an element may refer to an activated state of the element, and "OFF" may refer to an inactivated state of the element. "ON" used in association with a signal received by an element may refer to a signal for activating the element, and "OFF" may refer to a signal for deactivating the element. The element may be activated by a high-level voltage or a low-level voltage. For example, a p-channel transistor (p-type transistor) may be activated by a low-level voltage and an n-channel transistor (n-type transistor) may be activated by a high-level voltage. Accordingly, it should be understood that "ON" voltages for a p-type transistor and an n-type transistor are opposite (low versus high) voltage levels.

In the present specification, an x direction, a y direction, and a z direction are not limited to directions along three axes of the rectangular coordinate system and may be interpreted in a broader sense. For example, the x direction, the y direction, and the z direction may be perpendicular to one another, or may represent different directions that are not perpendicular to one another.

It will be understood that, although the terms "first," "second," "third" etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, "a first element," "component," "region," "layer" or "section" discussed below could be termed a second element, component, region, layer or section without departing from the teachings herein.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and the present disclosure, and will not be interpreted in an idealized or overly formal sense unless expressly so defined herein.

A display apparatus according to an embodiment may be an apparatus displaying a video or a static image. The electronic apparatus 10 may be used as a display screen of various devices, such as a television, a notebook computer, a monitor, a broadcasting panel, and an Internet of things (IOT) device, as well as portable electronic devices, such as a mobile phone, a smart phone, a tablet personal computer (PC), a mobile communication terminal, an electronic notebook, an electronic book, a portable multimedia player (PMP), a navigation device, and a ultra mobile PC (UMPC). Also, the display apparatus according to an embodiment may be used in wearable devices, such as a smart watch, a watch phone, a glasses-type display, and a head-mounted display (HMD). Also, the display apparatus, according to an embodiment, may be used as a center information display (CID) on a gauge of a vehicle or a center fascia or a dashboard of the vehicle, a room mirror display substituting a side-view mirror of a vehicle or a display disposed on a rear surface of a front seat, as an entertainment device for a backseat of a vehicle. Also, the display apparatus may be a flexible device.

Figure 2:
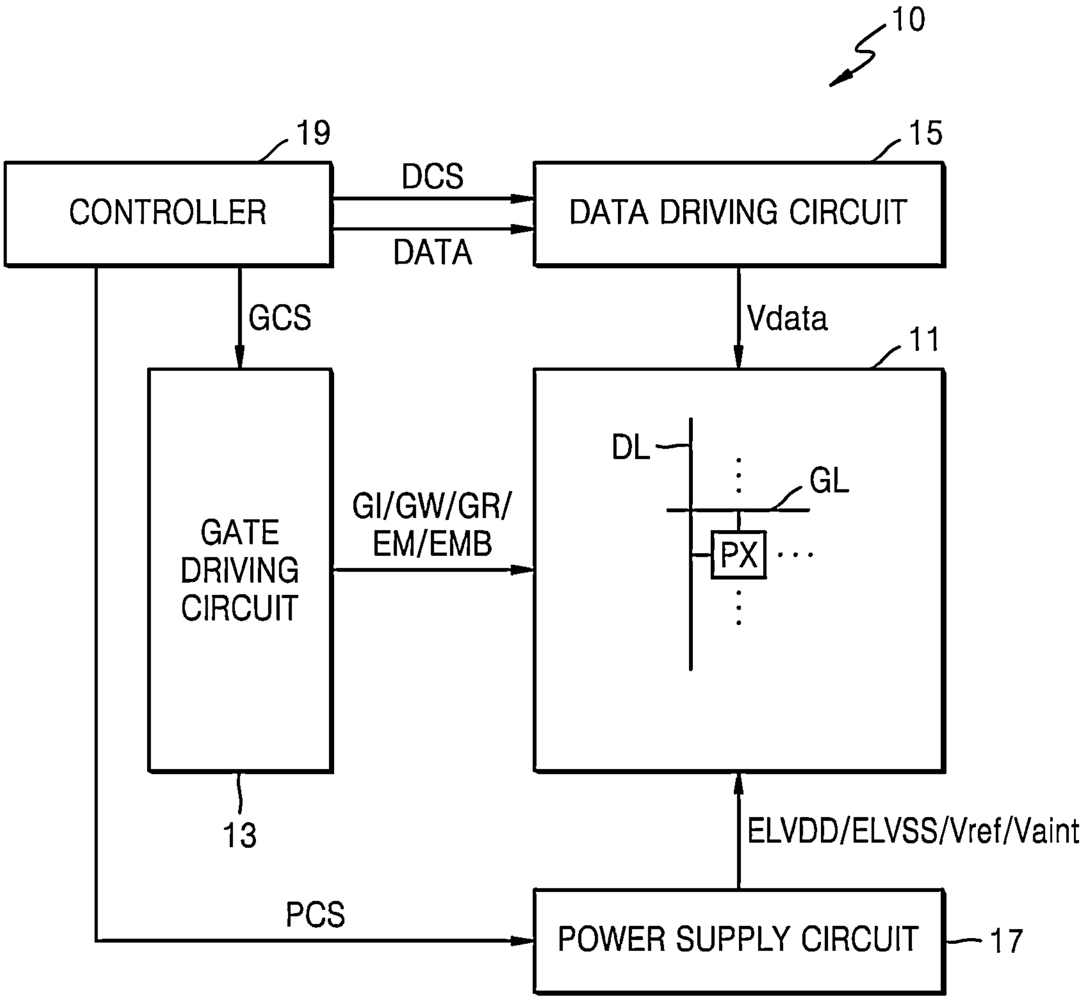
FIG. 2 is a diagram schematically showing a display apparatus, according to an embodiment.

FIGS. 1 and 2 are diagrams schematically showing a display apparatus 10, according to an embodiment.

In an embodiment and referring to FIG. 1, the display apparatus 10 may include a display area DA where an image is displayed and a peripheral area PA arranged around the display area DA. The display apparatus 10 may provide a certain image by using light emitted from pixels arranged in the display area DA. The peripheral area PA is an area arranged around the display area DA and may be a type of non-display area in which pixels are not arranged. The display area DA may be entirely surrounded by the peripheral area PA. In the peripheral area PA, various wiring lines configured to transmit electrical signals to be applied to the display area DA and pads to which a printed circuit board or a driver integrated circuit (IC) chip is attached may be located.

In an embodiment and referring to FIG. 2, the display apparatus 10 may include a pixel portion 11, a gate driving circuit 13, a data driving circuit 15, a power supply circuit 17, and a controller 19.

In an embodiment, the pixel portion 11 may be provided in the display area DA. In the peripheral area PA, various conductive lines configured to transmit electrical signals to be applied to the display area DA, external circuits electrically connected to pixel circuits, and pads to which a printed circuit board or a driver IC chip is attached may be located. For example, the gate driving circuit 13, the data driving circuit 15, the power supply circuit 17, and the controller 19 may be provided in the peripheral area PA.

In an embodiment and as shown in FIG. 2, a plurality of gate lines GL, a plurality of data lines DL, and a plurality of pixels connected to the plurality of gate lines GL and the plurality of data lines DL may be arranged in the display area DA. The plurality of pixels PX may be arranged in various arrangement forms, for example, a stripe form, a pentile form (diamond form), a mosaic form, etc., to realize an image. Each pixel PX may include an organic light-emitting diode as a display element (a light-emitting device), and the organic light-emitting diode may be connected to a pixel circuit. The pixel circuit may include a plurality of transistors and at least one capacitor. The pixel PX may emit, for example, red, green, blue, or white light through the organic light-emitting diode. Each pixel PX may be connected to at least one gate line corresponding to the pixel PX from among the plurality of gate lines GL and a data line corresponding to the pixel PX from among the plurality of data lines DL.

In an embodiment, each of the gate lines GL may extend in the x direction (a row direction) and may be connected to the pixels PX arranged in the same row. Each of the gate lines GL may be configured to transmit a gate signal to the pixels PX arranged in the same row. Each of the data lines DL may extend in the y direction (a column direction) and may be connected to the pixels PX arranged in the same column. Each of the data lines DL may be synchronized to the gate signal and may be configured to transmit a data signal to each of the pixels PX in the same column.

In an embodiment, the peripheral area PA may be a type of non-display area in which pixels PX are not arranged. In another embodiment, a portion of the peripheral area PA may be implemented as the display area DA. For example, a plurality of pixels PX may be arranged to overlap the gate driving circuit 13 in at least one corner of the peripheral area PA. Accordingly, a dead area may be reduced and the display area DA may be expanded.

In an embodiment, the gate driving circuit 13 may be connected to a plurality of gate lines GL, generate a gate signal in response to a control signal GCS from the controller 19, and sequentially supply the gate signal to the gate lines GL. Each of the gate lines GL may be connected to the gate of a transistor included in the pixel PX. The gate signal may be a gate control signal that controls the turn-on and turn-off of a transistor whose gate is connected to the gate line GL. The gate signal may be a square wave signal including an on-voltage at which the transistor may be turned on and an off-voltage at which the transistor may be turned off. In an embodiment, the on-voltage may be a high-level voltage (first level voltage) or a low-level voltage (second level voltage).

In an embodiment, FIG. 2 shows the case where the pixel PX is connected to one gate line GL. However, this embodiment is merely an example, and the pixel PX may be connected to two or more gate lines and the gate driving circuit 13 may supply two or more gate signals with different timings, to which the on-voltage is applied, to corresponding gate lines. For example, the pixel PX may be connected to first to third gate lines and first and second emission control lines, and the gate driving circuit 13 may respectively apply a first gate signal GW, a second gate signal GI, a third gate signal GR, a first emission control signal EM, and a second emission control signal EMB to first gate lines, second gate lines, third gate lines, first emission control lines, and second emission control lines. The first emission control signal EM may be a gate control signal that controls the turn-on and turn-off of a transistor whose gate is connected to the first emission control line, and the second emission control signal EMB may be a gate control signal that controls the turn-on and turn-off of a transistor whose gate is connected to the second emission control line.

In an embodiment, the data driving circuit 15 may be connected to a plurality of data lines DL and may supply a data signal to the data lines DL in response to a control signal DCS from the controller 19. The data signal supplied through the data lines DL may be supplied to the pixel PX to which the gate signal is supplied. The data driving circuit 15 may convert input image data having a gray level input from the controller 190 into a data signal in the form of voltage or current.

In an embodiment, the power supply circuit 17 may generate voltages necessary to drive the pixel PX in response to a control signal PCS from the controller 19. The power supply circuit 17 may generate a first driving voltage ELVDD and a second driving voltage ELVSS and supply them to the pixels PX. The first driving voltage ELVDD may be a high-level voltage provided to a first electrode (pixel electrode or anode) of the display element included in the pixel PX. The second driving voltage ELVSS may be a low-level voltage provided to a second electrode (opposite electrode or cathode) of the display element included in the pixel PX. The power supply circuit 17 may generate a reference voltage Vref and an initialization-voltage Vaint and supply them to the pixels PX.

In an embodiment, the voltage level of the first driving voltage ELVDD may be higher than the voltage level of the second driving voltage ELVSS. The voltage level of the reference voltage Vref may be lower than the voltage level of the first driving voltage ELVDD. The voltage level of the initialization-voltage Vaint may be the same as the voltage level of the second driving voltage ELVSS or may be higher than the voltage level of the second driving voltage ELVSS.

In an embodiment, the controller 19 may generate the control signals GCS, DCS, and PCS based on signals input from the outside and supply the control signals GCS, DCS, and PCS to the gate driving circuit 13, the data driving circuit 15, and the power supply circuit 17, respectively. The control signal GCS output to the gate driving circuit 13 may include a plurality of clock signals and a gate start signal. The control signal DCS output to the data driving circuit 15 may include a source start signal and clock signals.

In an embodiment, the display apparatus 10 may include a display panel, and the display panel may include a substrate. In an embodiment, the fact that the substrate has a display area DA and a peripheral area PA indicates that the substrate has an area corresponding to the display area DA and an area corresponding to the peripheral area PA. The pixels PX may be arranged in the display area DA of the substrate. A portion of the gate driving circuit 13 or the entire gate driving circuit 13 may be formed directly in the peripheral area PA of the substrate during the process of forming transistors constituting the pixel circuit in the display area DA of the substrate. The data driving circuit 15, the power supply circuit 17, and the controller 19 may be formed in the form of separate integrated circuit chips or one integrated circuit chip and may be arranged on a flexible printed circuit board (FPCB) electrically connected to pads disposed on one side of the substrate. In another embodiment, the data driving circuit 15, the power supply circuit 17, and the controller 19 may be arranged directly on the substrate by using a chip on glass (COG) or chip on plastic (COP) method.

In an embodiment, the plurality of transistors included in the pixel circuit may be N-type oxide thin-film transistors. In another embodiment, the plurality of transistors included in the pixel circuit may be P-type silicon thin-film transistors. In another embodiment, some of the plurality of transistors included in the pixel circuit may be N-type oxide thin-film transistors, and the others may be P-type silicon thin-film transistors.

In an embodiment, each of the N-type oxide thin-film transistors may be a low temperature polycrystalline oxide (LTPO) thin-film transistor in which an active pattern (semiconductor layer) includes oxide. However, this is an example and the N-type oxide thin-film transistors are not limited thereto. For example, the active pattern (semiconductor layer) included in the N-type oxide thin-film transistor may include an inorganic semiconductor (e.g., amorphous silicon or poly silicon) or an organic semiconductor. Each of the P-type silicon thin-film transistors may be a low temperature poly-silicon thin-film transistor in which an active pattern (semiconductor layer) includes amorphous silicon, poly silicon, etc.

Figure 3:
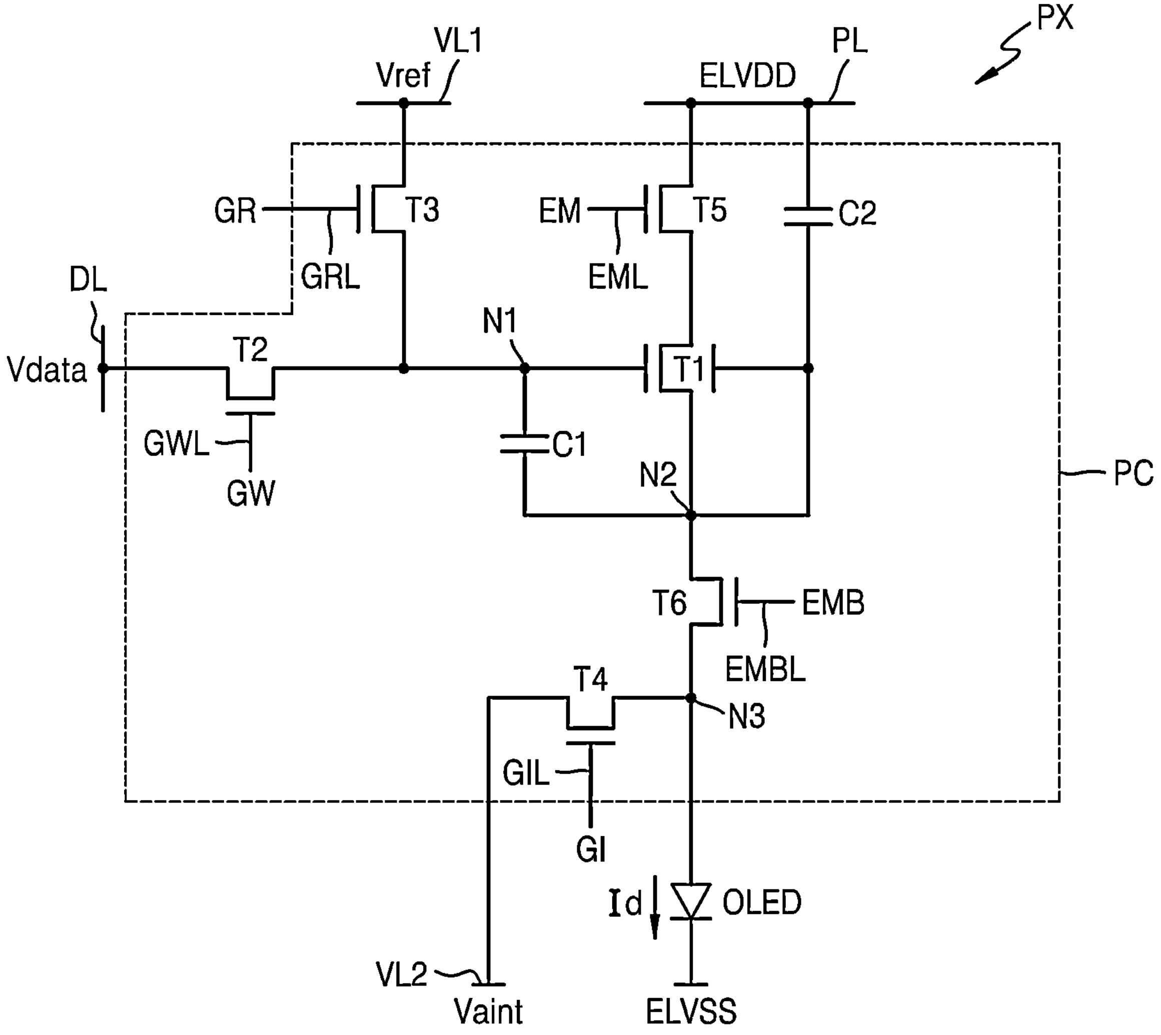
FIG. 3 is an equivalent circuit diagram of a pixel included in a display apparatus, according to an embodiment.
Figure 4:
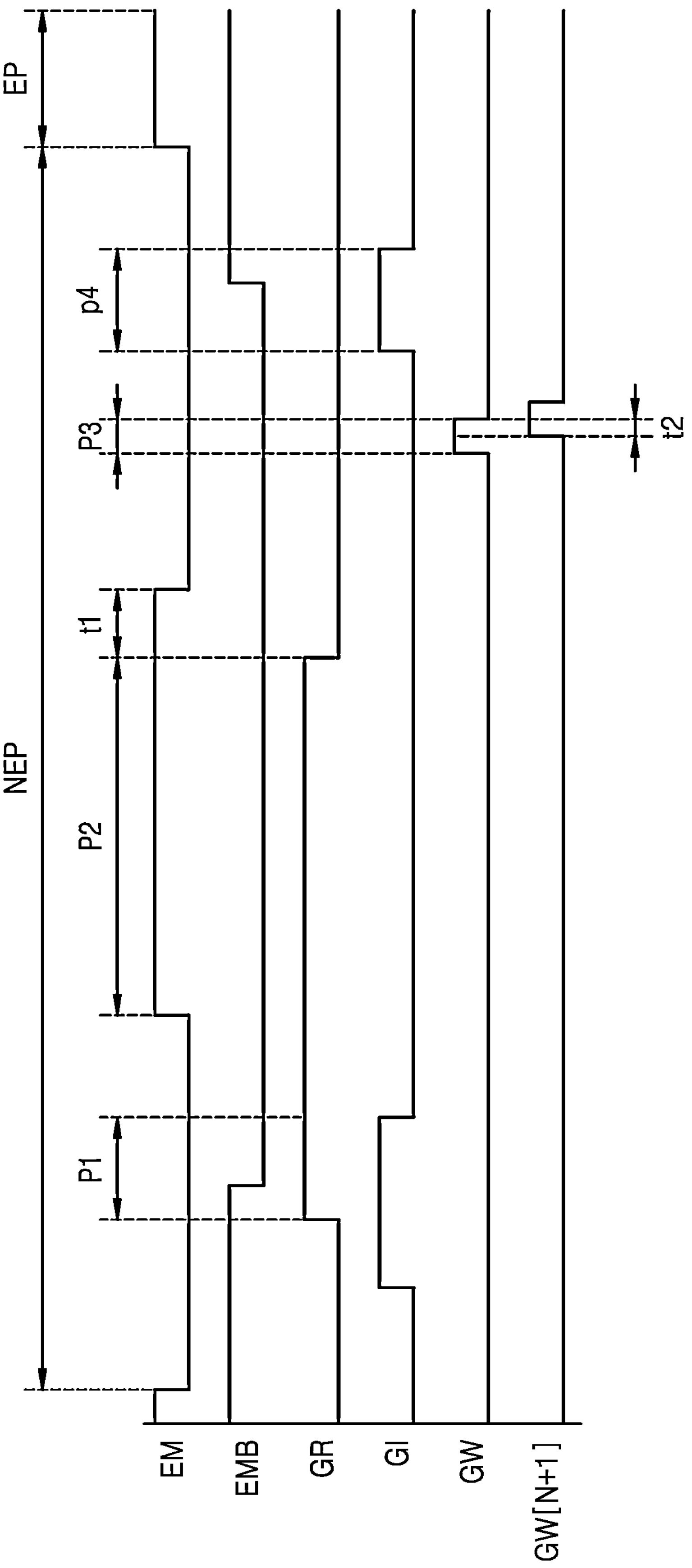
FIG. 4 is a timing diagram of signals for explaining the operation of the pixel shown in FIG. 3, according to an embodiment.

FIG. 3 is an equivalent circuit diagram of a pixel included in a display apparatus, according to an embodiment, and FIG. 4 is a timing diagram of signals for explaining the operation of the pixel shown in FIG. 3, according to an embodiment.

In an embodiment and referring to FIG. 3, the pixel PX may include an organic light-emitting diode OLED as a display element and a pixel circuit PC connected to the organic light-emitting diode OLED. The pixel circuit PC may include first to sixth transistors T1 to T6, respectively, and first and second capacitors C1 and C2, respectively. The first transistor T1 may be a driving transistor configured to output a driving current corresponding to a data signal, and the second to sixth transistors T2 to T6, respectively, may be switching transistors configured to transmit signals. A first terminal (first electrode) of each of the first to sixth transistors T1 to T6, respectively, may be a source or drain, and a second terminal (second electrode) of each of the first to sixth transistors T1 to T6, respectively, may be a terminal that is different from the first terminal. For example, when the first terminal is a drain, the second terminal may be a source. A node to which the gate of the first transistor T1 is connected may be defined as a first node N1, and a node to which the second terminal (source) of the first transistor T1 is connected may be defined as a second node N2. A node to which the pixel electrode (anode) of the organic light-emitting diode OLED is connected may be defined as a third node N3.

In an embodiment, the pixel PX may be connected to a first gate line GWL configured to transmit a first gate signal GW, a second gate line GIL configured to transmit a second gate signal GI, a third gate line GRL configured to transmit a third gate signal GR, a first emission control line EML configured to transmit a first emission control signal EM, a second emission control line EMBL configured to transmit a second emission control signal EMB, and a data line DL configured to transmit a data signal Vdata. In addition, the pixel PX may be connected to a driving voltage line PL configured to transmit a first driving voltage ELVDD, a reference voltage line VL1 configured to transmit a reference voltage Vref, and an initialization-voltage line VL2 configured to transmit an initialization-voltage Vaint.

In an embodiment, the first transistor T1 may be connected between the driving voltage line PL and the second node N2. The first transistor T1 may include a gate, a first terminal connected to the driving voltage line PL via the fifth transistor T5, and a second terminal connected to the second node N2. The first transistor T1 may include a first gate connected to the first node N1 and a second gate connected to the second node N2. The first gate and the second gate may be arranged to face each other on different layers. For example, the first gate and the second gate of the first transistor T1 may be positioned opposite to each other with a semiconductor layer therebetween. Because the first capacitor C1 is disposed between the first node N1 and the second node N2, the first transistor T1 may be disposed between the driving voltage line PL and the first capacitor C1. The first transistor T1 may receive the data signal Vdata according to the switching operation of the second transistor T2 and control the amount of driving current Id flowing to the organic light-emitting diode OLED.

In an embodiment, the second transistor T2 may be connected between the data line DL and the first node N1. The second transistor T2 may be connected between the data line DL and the first gate of the first transistor T1. The second transistor T2 may include a gate connected to the first gate line GWL, a first terminal connected to the data line DL, and a second terminal connected to the first node N1. The second transistor T2 may be configured to be turned on by the first gate signal GW transmitted through the first gate line GWL, electrically connect the data line DL to the first node N1, and transmit, to the first node N1, the data signal Vdata transmitted through the data line DL.

In an embodiment, the third transistor T3 may be connected between the first node N1 and the reference voltage line VL1. The third transistor T3 may be connected between the data line DL and the first gate of the first transistor T1. The third transistor T3 may include a gate connected to the third gate line GRL, a first terminal connected to the first node N1, and a second terminal connected to the reference voltage line VL1. The third transistor T3 may be configured to be turned on by the third gate signal GR transmitted through the third gate line GRL and transmit, to the first node N1, the reference voltage Vref transmitted through the reference voltage line VL1.

In an embodiment, the fourth transistor T4 may be connected between the first transistor T1 and the initialization-voltage line VL2. The fourth transistor T4 may include a gate connected to the second gate line GIL, a first terminal connected to the third node N3, and a second terminal connected to the initialization-voltage line VL2. The fourth transistor T4 may be configured to be turned on by the second gate signal GI transmitted through the second gate line GIL and transmit, to the third node N3, the initialization-voltage Vaint transmitted through the initialization-voltage line VL2.

In an embodiment, the fifth transistor T5 may be connected between the driving voltage line PL and the first transistor T1. The fifth transistor T5 may include a gate connected to the first emission control line EML, a first terminal connected to the driving voltage line PL, and a second terminal connected to the first terminal of the first transistor T1. The fifth transistor T5 may be configured to be turned on or off according to the first emission control signal EM transmitted through the first emission control line EML.

In an embodiment, the sixth transistor T6 may be connected between the first transistor T1 and the third node N3. The sixth transistor T6 may include a gate connected to the second emission control line EMBL, a first terminal connected to the second node N2, and a second terminal connected to the third node N3. The sixth transistor T6 may be configured to be turned on or off according to the second emission control signal EMB transmitted through the second emission control line EMBL.

In an embodiment, when the fifth transistor T5 is turned on according to the first emission control signal EM received through the first emission control line EML and the sixth transistor T6 is turned on according to the second emission control signal EMB received through the second emission control line EMBL, a driving current Id may flow to the organic light-emitting diode OLED.

In an embodiment, the first capacitor C1 may be connected between the first node N1 and the second node N2. The first electrode of the first capacitor C1 may be connected to the first node N1, and the second electrode of the first capacitor C1 may be connected to the second node N2. The first capacitor C1 may be a storage capacitor and may store a voltage corresponding to the threshold voltage of the first transistor T1 and a data signal.

In an embodiment, the second capacitor C2 may be connected between the driving voltage line PL and the second node N2. The first electrode of the second capacitor C2 may be connected to the driving voltage line PL, and the second electrode of the second capacitor C2 may be connected to the second node N2. The capacitance of the first capacitor C1 may be greater than the capacitance of the second capacitor C2.

In an embodiment, the organic light-emitting diode OLED may include a pixel electrode (anode) connected to the third node N3 and an opposite electrode (cathode) facing the pixel electrode, and the opposite electrode may be supplied with a second driving voltage ELVSS. The opposite electrode may be a common electrode common to a plurality of pixels PX.

In an embodiment, the pixel PX may display an image for each frame period. Referring to FIG. 4, one frame period may include a non-emission period NEP in which the pixel PX does not emit light, and an emission period EP. The non-emission period NEP may include a first initialization period P1, a compensation period P2, a writing period P3, and a second initialization period P4.

In an embodiment, the first gate signal GW, the second gate signal GI, the third gate signal GR, the first emission control signal EM, and the second emission control signal EMB may each have a high-level voltage for some periods and have a low-level voltage for some periods. Here, the high-level voltage may be an on-voltage that turns on a transistor, and the low-level voltage may be an off-voltage that turns off the transistor.

In an embodiment, in the first initialization period P1, the second gate signal GI having an on-voltage may be supplied to the second gate line GIL, and the third gate signal GR having an on-voltage may be supplied to the third gate line GRL. The first initialization period P1 may be defined as a period in which an on-voltage period (i.e., a period in which the on-voltage is maintained) of the second gate signal GI overlaps an on-voltage period of the third gate signal GR. In the first initialization period P1, the second emission control signal EMB may be supplied as an on-voltage and then inverted and supplied as an off-voltage. In other words, the second emission control signal EMB may be at an on-voltage and then be at an off-voltage that is an inverted voltage of the on-voltage. In addition, the first gate signal GW and the first emission control signal EM may each have an off-voltage.

In an embodiment, the fourth transistor T4 may be turned on by the second gate signal GI, and the third transistor T3 may be turned on by the third gate signal GR. During the first initialization period P1, the sixth transistor T6 in an on state may be turned off by the second emission control signal EMB. The first node N1, that is, the gate of the first transistor T1, may be initialized to the reference voltage Vref by the turned-on third transistor T3. The third node N3, that is, the pixel electrode of the organic light-emitting diode OLED, may be initialized to the initialization-voltage Vaint by the turned-on fourth transistor T4. The second node N2 may be initialized to the initialization-voltage Vaint by the turned-on fourth transistor T4 and the turned-on fifth transistor T5.

In an embodiment, in the compensation period P2, the third gate signal GR having an on-voltage may be supplied to the third gate line GRL, and the first emission control signal EM having an on-voltage may be supplied to the first emission control line EML. The compensation period P2 may be defined as a period in which an on-voltage period of the third gate signal GR overlaps an on-voltage period of the first emission control signal EM. In addition, the first gate signal GW, the second gate signal GI, and the second emission control signal EMB may each have an off-voltage.

In an embodiment, the third transistor T3 may be turned on by the third gate signal GR, and the fifth transistor T5 may be turned on by the first emission control signal EM. Accordingly, the reference voltage Vref may be supplied to the first node N1 and the first driving voltage ELVDD may be supplied to the first terminal of the first transistor T1, and thus, the first transistor T1 may be turned on. When the voltage of the second terminal of the first transistor T1, that is, the second node N2, falls below the difference (Vref-Vth) between the reference voltage Vref and the threshold voltage Vth of the first transistor T1, the first transistor T1 may be turned off. In addition. a voltage corresponding to the threshold voltage Vth of the first transistor T1 may be stored in the first capacitor C1, and thus, the threshold voltage Vth of the first transistor T1 may be compensated.

In an embodiment, the third gate signal GR may maintain an on-voltage from the starting point of the first initialization period P1 and then inverted at the end point of the compensation period P2 to be supplied as an off-voltage. The first emission control signal EM may maintain an on-voltage for a first time t1 from the end point of the compensation period P2. After the end point of the compensation period P2, when the third gate signal GR is at an off-voltage, the third transistor T3 may be turned off and the first node N1 may be electrically floated for a first time t1. Therefore, when the voltage of the first emission control signal EM is inverted to the off-voltage, the gate-source voltage Vgs of the first transistor T1 may be maintained relatively constant, and a kickback phenomenon caused by the turn-off of the fifth transistor T5 may be reduced. In an embodiment, the first time t1 may be 4 horizontal periods (4H).

In an embodiment, in the write period P3, the first gate signal GW having an on-voltage may be supplied to the first gate line GWL, and thus, the second transistor T2 may be turned on. In this case, the second gate signal GI, the third gate signal GR, the first emission control signal EM, and the second emission control signal EMB may each be at an off-voltage, and the third to sixth transistors T3, T4, T5, and T6, respectively, may be turned off. The second transistor T2 may transmit the data signal Vdata from the data line DL to the first node N1, that is, the gate of the first transistor T1. Accordingly, the voltage of the first node N1 may be changed from the reference voltage Vref to a voltage corresponding to the data signal Vdata.

In an embodiment, a first gate signal GW applied to a pixel circuit in an nth row may partially overlap a first gate signal GWn+1 applied to a pixel circuit in a next row ((n+1)th row). For example, the first gate signal GW applied to the pixel circuit in the nth row and the first gate signal GWn+1 applied to the pixel circuit in the (n+1)th row may overlap each other for at least 2 horizontal periods (2H). By making the first gate signals GW and GWn+1 partially overlap each other, high frequency driving of the display apparatus 10 may be possible.

In an embodiment, in the second initialization period P4, the second gate signal GI having an on-voltage may be supplied to the second gate line GIL. The second initialization period P4 may be defined as an on-voltage period of the second gate signal GI after the write period P3. In the second initialization period P4, the second emission control signal EMB may be at an off-voltage and then be at an on-voltage that is an inverted voltage of the off-voltage. In addition, the first gate signal GW, the third gate signal GR, and the first emission control signal EM may each be at an off-voltage, and the second transistor T2, the third transistor T3, and the fifth transistor T5 may be turned off. The fourth transistor T4 may be turned on by the second gate signal GI, and the sixth transistor T6 may be turned on by the second emission control signal EMB. The third node N3, that is, the pixel electrode of the organic light-emitting diode OLED, may be initialized to the initialization-voltage Vaint by the turned-on fourth transistor T4. The second node N2 may be initialized to the initialization-voltage Vaint by the turned-on fourth transistor T4 and the turned-on fifth transistor T5. By initializing the second node N2 before the emission period EP, the variable refresh rate characteristics of the display apparatus 10 may be improved.

In an embodiment, even after the end point of the second initialization period P4, the second emission control signal EMB may maintain the on-voltage. Afterwards, in the emission period EP, the first emission control signal EM may be at an on-voltage and the first gate signal GW, the second gate signal GI, and the third gate signal GR may each be at an off-voltage. The second transistor T2, the third transistor T3, and the fourth transistor T4 may be turned off by the first gate signal GW, the third gate signal GR, and the second gate signal GI, respectively, and the fifth transistor T5 and the sixth transistor T6 may be turned on by the first emission control signal EM and the second emission control signal EMB, respectively.

In an embodiment, the first transistor T1 may output a driving current Id having a size corresponding to the gate-source voltage (Vgs), and the organic light-emitting diode OLED may emit light with a luminance corresponding to the size of the driving current Id.

Figure 5:
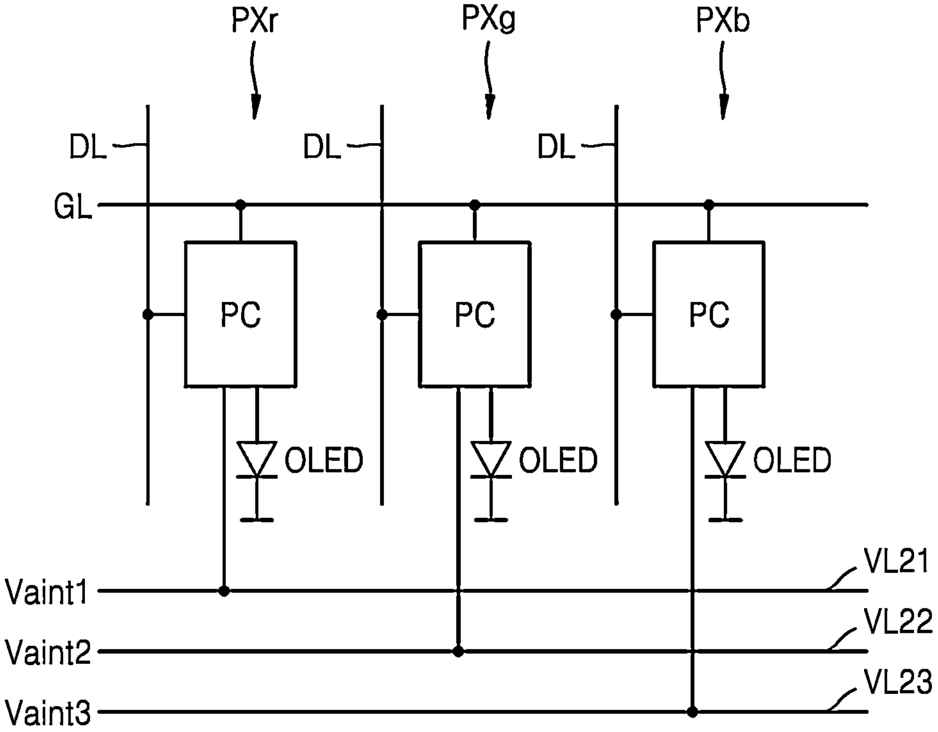
FIG. 5 is a circuit diagram schematically showing a connection relationship between pixels and second initialization-voltage lines, according to an embodiment.

FIG. 5 is a diagram schematically showing a connection relationship between pixels and initialization-voltage lines, according to an embodiment.

In an embodiment and referring to FIG. 5, the pixels may include a first pixel PXr that emits light in a first color, a second pixel PXg that emits light in a second color, and a third pixel PXb that emits light in a third color. For example, the first pixel PXr may be a red pixel, the second pixel PXg may be a green pixel, and the third pixel PXb may be a blue pixel. In an embodiment, by considering the light emission characteristics of the first pixel PXr, the second pixel PXg, and the third pixel PXb, different initialization-voltages Vaint may be supplied to the first pixel PXr, the second pixel PXg, and the third pixel PXb.

In an embodiment and as shown in FIG. 5, the first pixel PXr may be connected to a first initialization-voltage line VL21 configured to supply a first initialization-voltage Vaint1, the second pixel PXg may be connected to a second initialization-voltage line VL22 configured to supply a second initialization-voltage Vaint2, and the third pixel PXb may be connected to a third initialization-voltage line VL23 configured to supply a third initialization-voltage Vaint3. The first initialization-voltage Vaint1, the second initialization-voltage Vaint2, and the third initialization-voltage Vaint3 may have different levels.

In another embodiment, the first pixel PXr and the third pixel PXb may be connected to the first initialization-voltage line VL21, and the second pixel PXg may be connected to the second initialization-voltage line VL22. In another embodiment, the first pixel PXr and the second pixel PXg may be connected to the first initialization-voltage line VL21, and the third pixel PXb may be connected to the second initialization-voltage line VL22. In another embodiment, the first pixel PXr may be connected to the first initialization-voltage line VL21, and the second pixel PXg and the third pixel PXb may be connected to the second initialization-voltage line VL22.

In an embodiment, a second initialization-voltage line VL22 connected to at least one of the first pixel PXr, the second pixel PXg, and the third pixel PXb may be individually provided and different initialization voltages Vaint may be supplied, thereby improving low-gradation luminance change and color change issues caused by differences in characteristics of the organic light-emitting diode OLED.

Figure 6:
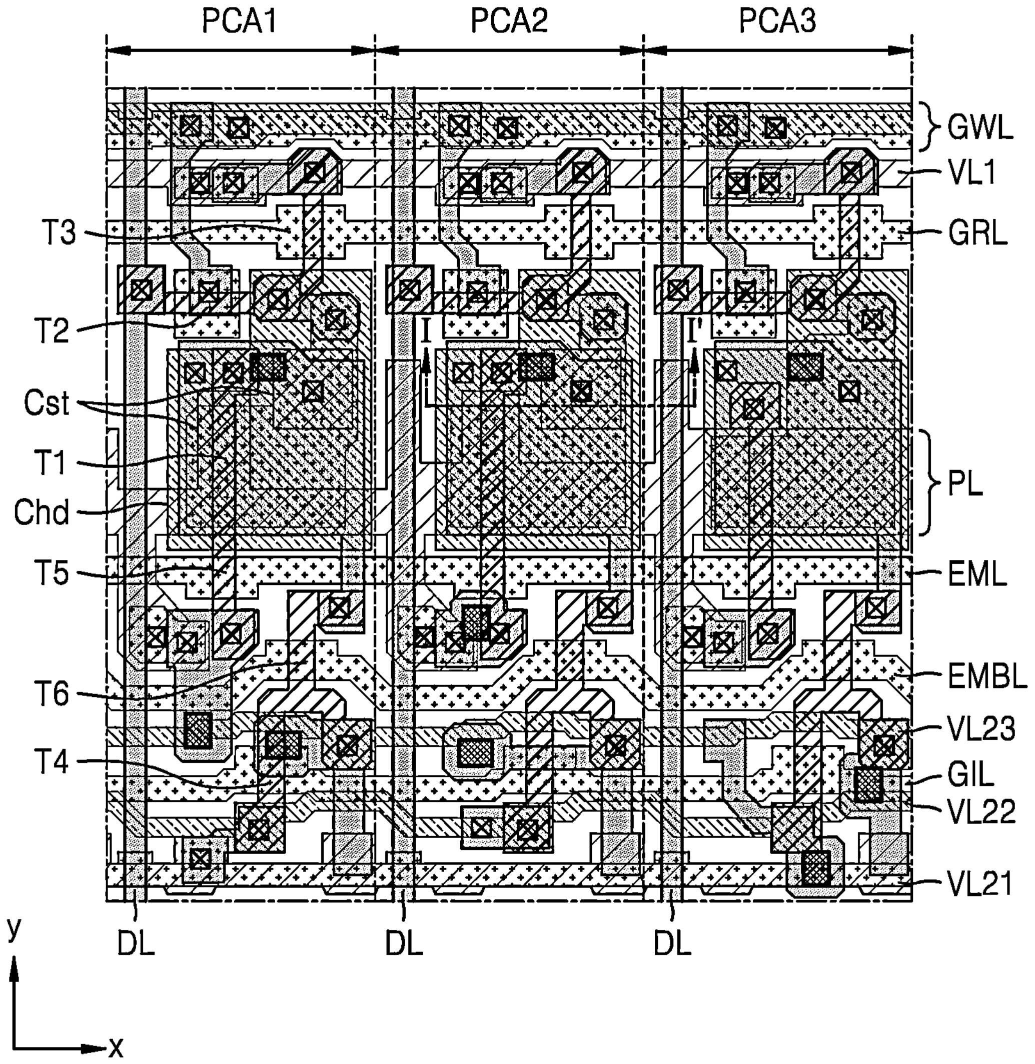
FIG. 6 is a layer-by-layer layout diagram schematically showing pixels, according to an embodiment.

FIGS. 6 to 11 are layer-by-layer layout diagrams schematically showing pixels, according to an embodiment. FIG. 6 is a layout diagram schematically showing the locations of transistors and capacitors of the pixel circuit shown in FIG. 3, according to an embodiment. FIGS. 7 to 11 are layout diagrams schematically showing components of a pixel circuit by layer, according to an embodiment.

In an embodiment, the display area DA of the substrate is an area where rows (pixel rows) and columns (pixel columns) intersect, and may include a plurality of circuit areas where pixel circuits are arranged. In an embodiment, a unit circuit area may be defined including two or more circuit areas adjacent to each other in the x direction, and a unit pixel may be defined by pixels arranged in the circuit areas constituting the unit circuit area. For example, the unit circuit area may include a first circuit area PCA1, a second circuit area PCA2, and a third circuit area PCA3, which are disposed adjacent to each other in the x direction, and the unit pixel may include a first pixel PXr, a second pixel PXg, and a third pixel PXb. The first circuit area PCA1 may be an area where the pixel circuit of the first pixel PXr is arranged. The second circuit area PCA2 may be an area where the pixel circuit of the second pixel PXg is arranged. The third circuit area PCA3 may be an area where the pixel circuit of the third pixel PXb is arranged.

In an embodiment, identical elements may be arranged in each layer of the first circuit area PCA1, the second circuit area PCA2, and the third circuit area PCA3. Hereinafter, for convenience of illustration and description, the same identification numbers will be assigned to the components of the pixel circuits PC that are the same as one another, and the description will focus on the first circuit area PCA1. The description of the first circuit area PCA1 may be equally applied to the same components of the second circuit area PCA2 and the third circuit area PCA3.

In an embodiment and referring to FIG. 6, the pixel circuits arranged in the first circuit area PCA1, the second circuit area PCA2, and the third circuit area PCA3 may each correspond to the pixel circuit PC of the pixel PX shown in FIG. 3. FIGS. 7 to 11 each show one conductive layer or semiconductor layer. In the present specification, the fact that certain components are “located on the same layer” means that the components are formed through the same manufacturing process, include the same material, and have the same layer structure, film quality, electrical properties, etc. At least one insulating layer may be disposed between the conductive layers and the semiconductor layer. Hereinafter, descriptions will be given with reference to FIGS. 7 to 11. Hereinafter, a connection electrode may be an electrode that transmits a signal by electrically connecting wiring lines and conductive patterns arranged in different layers.

Figure 7:
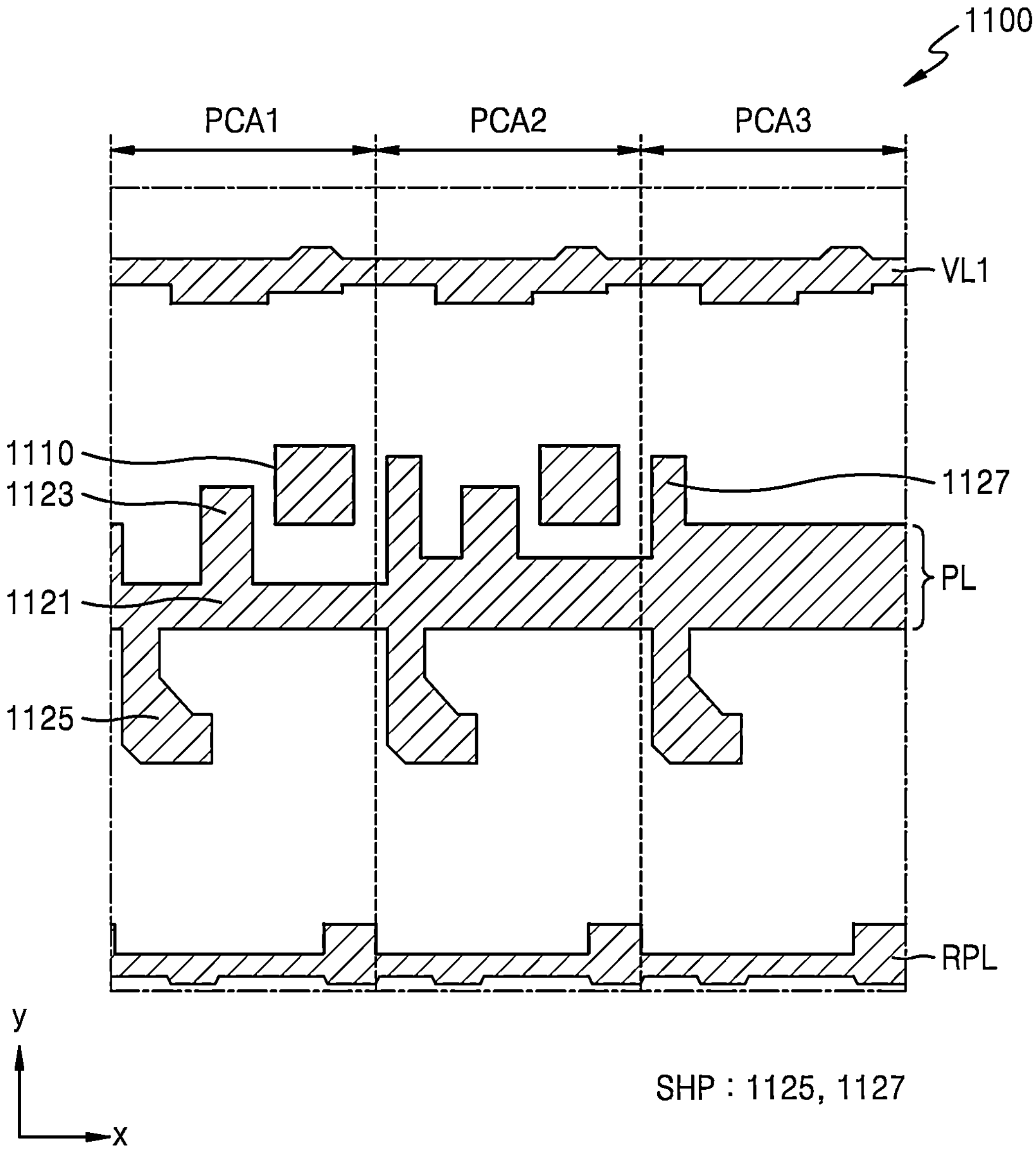
FIG. 7 is a layer-by-layer layout diagram schematically showing pixels, according to an embodiment.

In an embodiment, a first conductive layer 1100 may be disposed on a substrate. As shown in FIG. 7, the first conductive layer 1100 may include a driving voltage line PL, a reference voltage line VL1, a repair line RPL, and a first conductive pattern 1110.

In an embodiment, the first conductive pattern 1110 may be of an island type and may be arranged in each of the first circuit area PCA1 and the second circuit area PCA2. In an embodiment, the first conductive pattern 1110 may not be arranged in the third circuit area PCA3. The first conductive pattern 1110 may be a first capacitor electrode of the first capacitor C1 described above.

In an embodiment, the driving voltage line PL may extend in a first direction (x direction) and may cross the first circuit area PCA1, the second circuit area PCA2, and the third circuit area PCA3. The first driving voltage ELVDD may be applied to the driving voltage line PL. The driving voltage line PL may include a body portion 1121 extending in the first direction (x direction) in each circuit area, an electrode portion 1123 protruding from the body portion 1121 in a second direction (y direction), and a shielding portion SHP protruding from the body portion 1121 in the second direction (y direction).

In an embodiment, the width of the body portion 1121 of the driving voltage line PL in the second direction (y direction) may be different in each circuit area. For example, the width of the body portion 1121 in the first circuit area PCA1 may be less than the width of the body portion 1121 in the second circuit area PCA2, and the width of the body portion 1121 in the second circuit area PCA2 may be less than the width of the body portion 1121 in the third circuit area PCA3.

In an embodiment, the electrode portion 1123 may be arranged in each of the first circuit area PCA1 and the second circuit area PCA2. The electrode portion 1123 may overlap a first semiconductor pattern 1310 (see FIG. 9) and may include a first capacitor electrode of the second capacitor C2 described above. The electrode portion 1123 may not be arranged in the third circuit area PCA3.

In an embodiment, the shielding portion SHP may include a first shielding portion 1125 and a second shielding portion 1127, which extend in opposite directions. For example, the first shielding portion 1125 may extend in a −y direction, and the second shielding portion 1127 may extend in a +y direction. In an embodiment, the area of the shielding portion SHP may be different in each circuit area. For example, the area of the shielding portion SHP of the first circuit area PCA1 may be less than the area of the shielding portion SHP of the second circuit area PCA2 and the area of the shielding portion SHP of the third circuit area PCA3. The shielding portion SHP of the first circuit area PCA1 may include only the first shielding portion 1125, and the second circuit area PCA2 and the third circuit area PCA3 may each include the first shielding portion 1125 and the second shielding portion 1127. In another embodiment, the area of the shielding portion SHP may be substantially the same in each circuit area. For example, the shielding portion SHP of the first circuit area PCA1, the shielding portion SHP of the second circuit area PCA2, and the shielding portion SHP of the third circuit area PCA3 may each have the first shielding portion 1125 and the second shielding portion 1127.

In an embodiment and when viewed in a plan view, the shielding portion SHP may be arranged to be apart from the first semiconductor pattern 1310. In other words, the shielding portion SHP may not overlap the first semiconductor pattern 1310. The shielding portion SHP may overlap a data line DL.

In an embodiment, the reference voltage line VL1 may extend in the first direction (x direction) and may cross the first circuit area PCA1, the second circuit area PCA2, and the third circuit area PCA3. The reference voltage line VL1 may be configured to transmit the reference voltage Vref to the second terminal of the third transistor T3.

In an embodiment, when a data signal applied to the data line DL changes, the reference voltage Vref of the reference voltage line VL1 may be instantly changed due to the coupling of a parasitic capacitor formed between the reference voltage line VL1 and the data line DL. Because the reference voltage line VL1 is connected to the gate of the first transistor T1, the voltage change of the reference voltage line VL1 may be caused by the gate-source voltage of the first transistor T1. Accordingly, pixels connected to the same reference voltage line VL1 may emit light with a luminance that is different from a predetermined luminance, resulting in horizontal line crosstalk in which line-shaped spots appear in images.

In an embodiment, the first conductive layer 1100, which is a conductive layer located at the bottom, includes the reference voltage line VL1, thereby increasing the distance between the reference voltage line VL1 and the data line DL. Accordingly, the display apparatus 10 may display a high-quality image in which the parasitic capacitance between the reference voltage line VL1 and the data line DL is reduced, thereby preventing or reducing line crosstalk.

In an embodiment, the repair line RPL extends in the first direction (x-direction) and may cross the first circuit area PCA1, the second circuit area PCA2, and the third circuit area PCA3.

Figure 8:
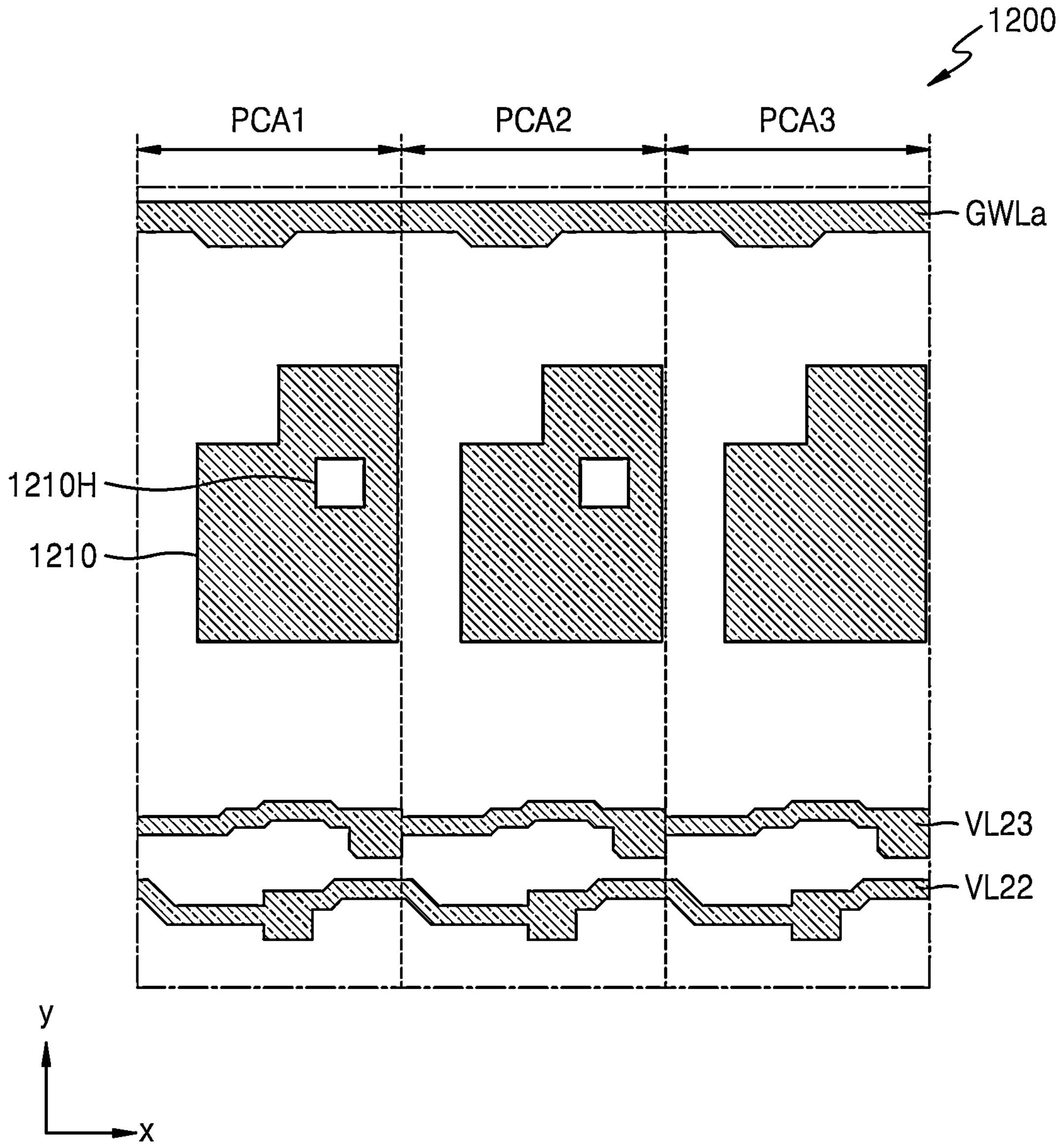
FIG. 8 is a layer-by-layer layout diagram schematically showing pixels, according to an embodiment.

In an embodiment, a first insulating layer may be disposed on the first conductive layer 1100, and a second conductive layer 1200 may be disposed on the first insulating layer, as shown in FIG. 8. The second conductive layer 1200 may include a lower first gate line GWLa, a second initialization-voltage line VL22, a third initialization-voltage line VL23, and a second conductive pattern 1210.

In an embodiment, the second conductive pattern 1210 may be of an island type and may be arranged in each of the first circuit area PCA1, the second circuit area PCA2, and the third circuit area PCA3. In each of the first circuit area PCA1 and the second circuit area PCA2, the second conductive pattern 1210 may be arranged to overlap the first conductive pattern 1110 and may define a hole 1210H exposing a portion of the first conductive pattern 1110. The second conductive pattern 1210 may include a lower gate electrode of the first transistor T1, a second capacitor electrode of the first capacitor C1, and a second capacitor electrode of the second capacitor C2. A portion of the second conductive pattern 1210 and a portion of the driving voltage line PL may overlap each other to form the second capacitor C2.

In an embodiment, the lower first gate line GWLa, the second initialization-voltage line VL22, and the third initialization-voltage line VL23 may extend in the first direction (x direction) and may cross the first circuit area PCA1, the second circuit area PCA2, and the third circuit area PCA3.

In an embodiment, the second initialization-voltage line VL22 may be connected to the pixel circuit PC of the second pixel PXg located in the second circuit area PCA2, and the third initialization-voltage line VL23 may be connected to the pixel circuit PC of the third pixel PXb located in the second circuit area PCA2. An initialization-voltage supplied to the second initialization-voltage line VL22 may be different from an initialization-voltage supplied to the third initialization-voltage line VL23.

Figure 9:
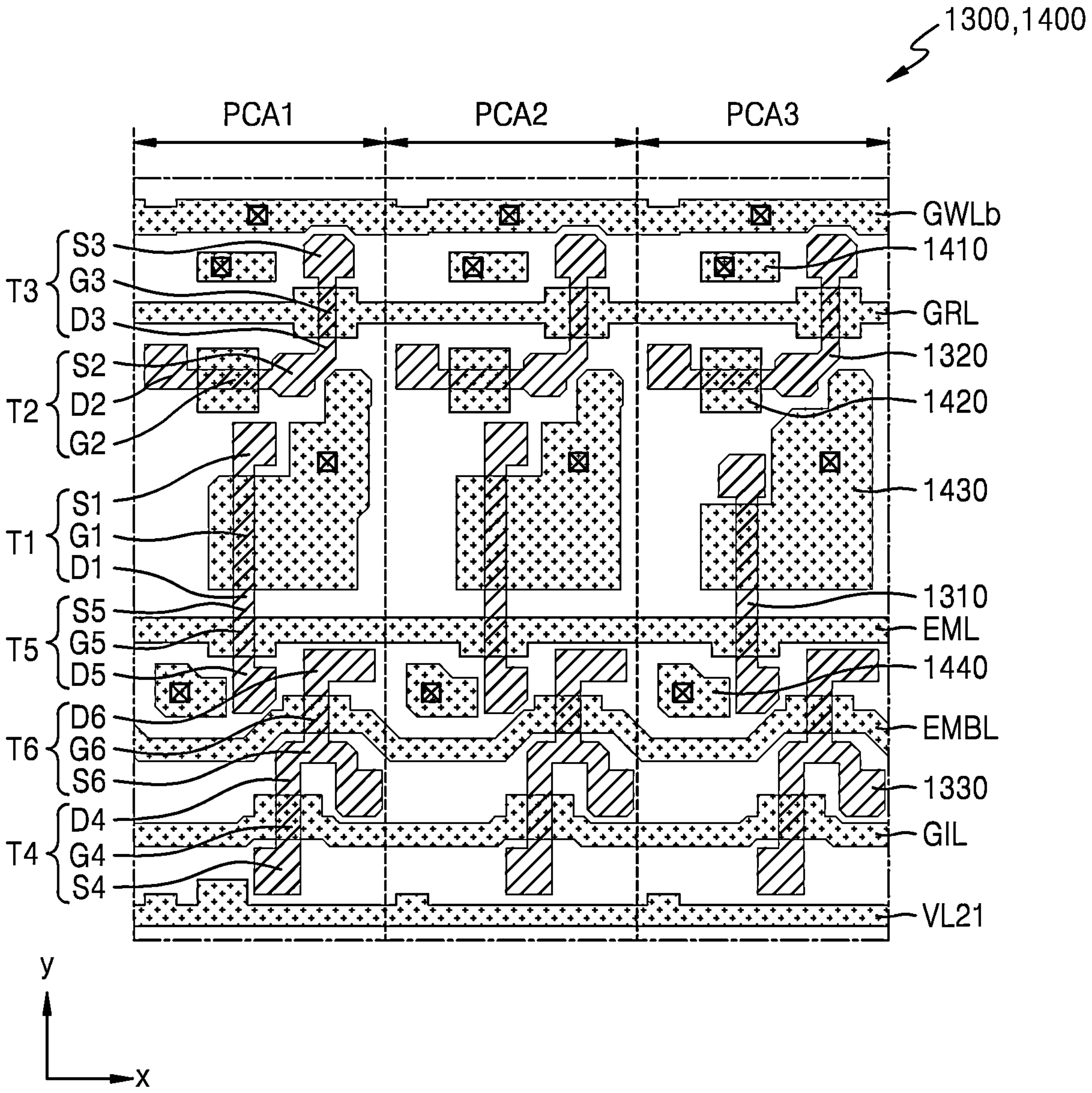
FIG. 9 is a layer-by-layer layout diagram schematically showing pixels, according to an embodiment.

In an embodiment, t second insulating layer may be disposed on the second conductive layer 1200, and a semiconductor layer 1300 may be disposed on the second insulating layer, as shown in FIG. 9. A third insulating layer may be disposed on the semiconductor layer 1300, and a third conductive layer 1400 may be disposed on the third insulating layer. FIG. 9 shows the semiconductor layer 1300 and the third conductive layer 1400 together for convenience of description.

In an embodiment, the semiconductor layer 1300 may include an oxide semiconductor material. The semiconductor layer 1300 may include a first semiconductor pattern 1310, a second semiconductor pattern 1320, and a third semiconductor pattern 1330. The first semiconductor pattern 1310, the second semiconductor pattern 1320, and the third semiconductor pattern 1330 may each include a source region, a drain region, and a channel region of each of the first to sixth transistors T1 to T6, respectively, the channel region being between the source region and the drain region.

In an embodiment, the first semiconductor pattern 1310 may include a source region S1 and a drain region D1 of the first transistor T1, and a source region S5 and a drain region D5 of the fifth transistor T5. The second semiconductor pattern 1320 may include a source region S2 and a drain region D2 of the second transistor T2, and a source region S3 and a drain region D3 of the third transistor T3. The third semiconductor pattern 1330 may include a source region S4 and a drain region D4 of the fourth transistor T4, and a source region S6 and a drain region D6 of the sixth transistor T6.

In an embodiment, the third conductive layer 1400 may include an upper first gate line GWLb, a second gate line GIL, a third gate line GRL, a first emission control line EML, a second emission control line EMBL, a first initialization-voltage line VL21, a first connection electrode 1410, a third conductive pattern 1420, a fourth conductive pattern 1430, and a second connection electrode 1440.

In an embodiment, the first connection electrode 1410 may overlap the reference voltage line VL1 and may be connected to the reference voltage line VL1 through a contact hole.

In an embodiment, the third conductive pattern 1420 and the fourth conductive pattern 1430 may be provided as an island type. The third conductive pattern 1420 and the fourth conductive pattern 1430 may be arranged in each of the first circuit area PCA1, the second circuit area PCA2, and the third circuit area PCA3.

In an embodiment, the third conductive pattern 1420 may overlap the second semiconductor pattern 1320 and may include a gate electrode of the second transistor T2. The fourth conductive pattern 1430 may overlap the first semiconductor pattern 1310 and may be connected to the first conductive pattern 1110 through a contact hole that overlaps the hole 1210H of the second conductive pattern 1210. The fourth conductive pattern 1430 may include an upper gate electrode G1 of the first transistor T1 and a third capacitor electrode of the first capacitor C1.

In an embodiment, the second connection electrode 1440 may overlap the first shielding portion 1125 of the driving voltage line PL and may be connected to the driving voltage line PL through a contact hole.

In an embodiment, the upper first gate line GWLb, the second gate line GIL, the third gate line GRL, the first emission control line EML, the second emission control line EMBL, and the first initialization-voltage line VL21 may extend in the first direction (x direction) and may cross the first circuit area PCA1, the second circuit area PCA2, and the third circuit area PCA3.

In an embodiment, the upper first gate line GWLb may approximately overlap the lower first gate line GWLa and may be connected to the lower first gate line GWLa through a contact hole. The lower first gate line GWLa and the upper first gate line GWLb may overlap the second semiconductor pattern 1320.

In an embodiment, the second gate line GIL may overlap the third semiconductor pattern 1330. The second gate line GIL may include a gate electrode G4 of the fourth transistor T4. The third gate line GRL may overlap the second semiconductor pattern 1320. The third gate line GRL may include a gate electrode G3 of the third transistor T3. The first emission control line EML may overlap the first semiconductor pattern 1310. The first emission control line EML may include a gate electrode G5 of the fifth transistor T5. The second emission control line EMBL may overlap the third semiconductor pattern 1330. The second emission control line EMBL may include a gate electrode G6 of the sixth transistor T6.

In an embodiment, the first initialization-voltage line VL21 may be connected to the pixel circuit PC of the first pixel PXr located in the first circuit area PCA1. An initialization-voltage supplied to the first initialization-voltage line VL21 may be different from an initialization-voltage supplied to the second initialization-voltage line VL22 and an initialization-voltage supplied to the third initialization-voltage line VL23.

Figure 10:
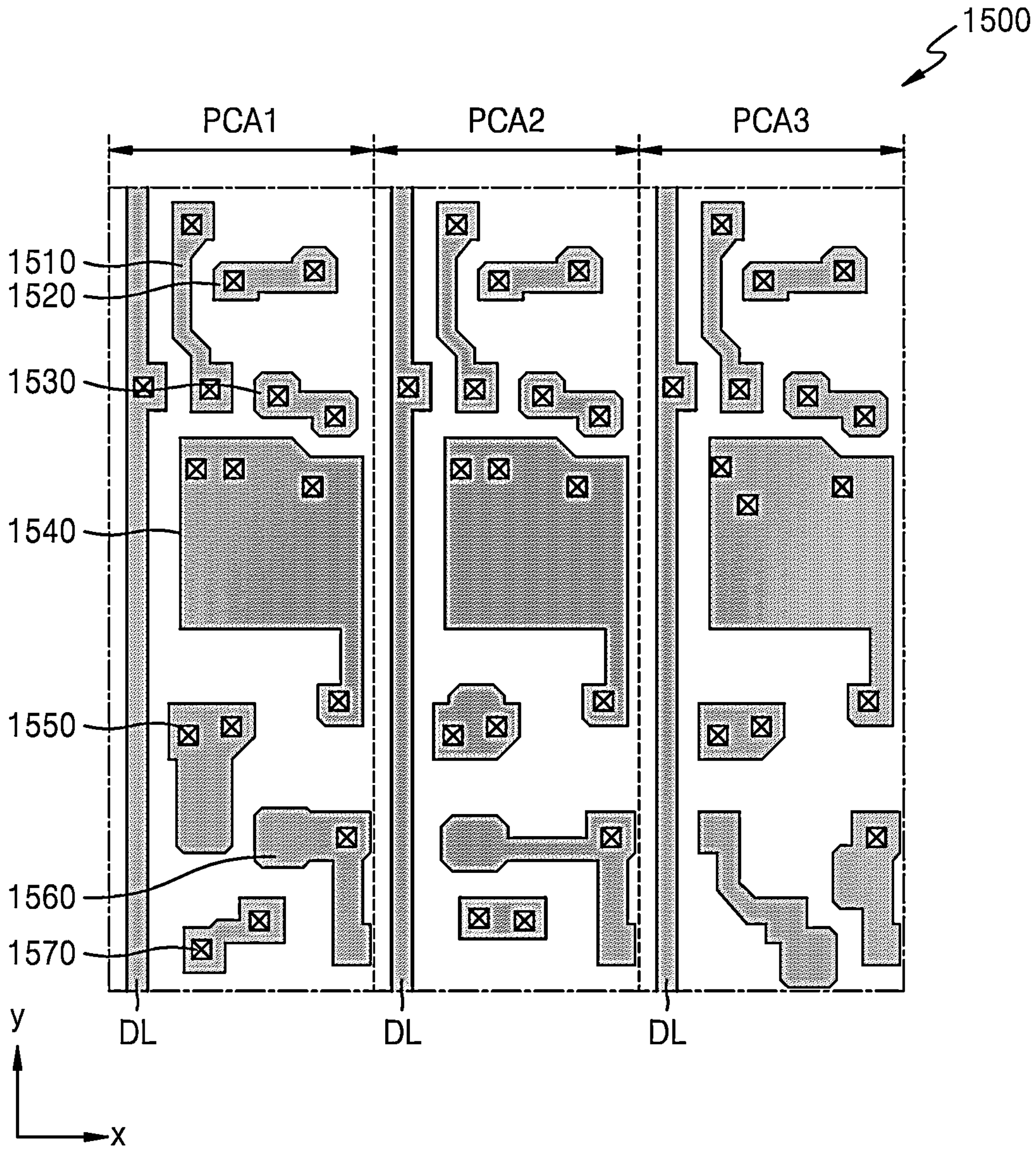
FIG. 10 is a layer-by-layer layout diagram schematically showing pixels, according to an embodiment.

In an embodiment, a fourth insulating layer may be disposed on the third conductive layer 1400, and a fourth conductive layer 1500 may be disposed on the fourth insulating layer, as shown in FIG. 10. The fourth conductive layer 1500 may include a data line DL, a third connection electrode 1510, a fourth connection electrode 1520, a fifth connection electrode 1530, a fifth conductive pattern 1540, a sixth connection electrode 1550, a seventh connection electrode 1560, and an eighth connection electrode 1570.

In an embodiment, the data line DL may be arranged to extend in the second direction (y direction) in each of the first circuit area PCA1, the second circuit area PCA2, and the third circuit area PCA3. The data line DL may be electrically connected to the drain region D2 of the second transistor T2 through a contact hole passing through the insulating layers. The data line DL may overlap the shielding portion SHP.

In an embodiment, the third connection electrode 1510 may connect the upper first gate line GWLb to the third conductive pattern 1420 through contact holes. The third conductive pattern 1420 may transmit the first gate signal GW from the lower first gate line GWLa and the upper first gate line GWLb to a gate electrode G2 of the second transistor T2.

In an embodiment, the fourth connection electrode 1520 may connect the first connection electrode 1410 to the second semiconductor pattern 1320 through contact holes. The fourth connection electrode 1520 may be connected to the reference voltage line VL1 through the first connection electrode 1410 and may transmit the reference voltage Vref from the reference voltage line VL1 to the source region S3 of the third transistor T3. Because one end of the second semiconductor pattern 1320 is connected to the data line DL and the other end of the second semiconductor pattern 1320 is connected to the reference voltage line VL1, the second semiconductor pattern 1320 may be connected between the data line DL and the reference voltage line VL1.

In an embodiment, the fifth connection electrode 1530 may connect the second semiconductor pattern 1320 to the fourth conductive pattern 1430 through contact holes. The fifth connection electrode 1530 may connect the source region S2 of the second transistor T2, the drain region D3 of the third transistor T3, the upper gate electrode G1 of the first transistor T1, and the third capacitor electrode of the first capacitor C1 to each other.

In an embodiment, the fifth conductive pattern 1540 may overlap the fourth conductive pattern 1430 and may connect the second conductive pattern 1210, the first semiconductor pattern 1310, and the third semiconductor pattern 1330 to each other through contact holes. The fifth conductive pattern 1540 may include a fourth capacitor electrode of the first capacitor C1. The fifth conductive pattern 1540 may connect the lower gate electrode of the first transistor T1, the second capacitor electrode of the first capacitor C1, the second capacitor electrode of the second capacitor C2, the source region S1 of the first transistor T1, and the drain region D6 of the sixth transistor T6 to each other. A portion of the first conductive pattern 1110, a portion of the second conductive pattern 1210, a portion of the fourth conductive pattern 1430, and a portion of the fifth conductive pattern 1540, which overlap each other, may form the first capacitor C1, In an embodiment, the sixth connection electrode 1550 may connect the first semiconductor pattern 1310 to the second connection electrode 1440 through contact holes. Because the second connection electrode 1440 is connected to the driving voltage line PL, the sixth connection electrode 1550 may transmit the first driving voltage ELVDD from the driving voltage line PL to the drain region D5 of the fifth transistor T5.

In an embodiment, the seventh connection electrode 1560 may be connected to the third semiconductor pattern 1330 through a contact hole. The seventh connection electrode 1560 may connect the pixel electrode of the organic light-emitting diode OLED, the drain region D4 of the fourth transistor T4, and the source region S6 of the sixth transistor T6 to each other.

In an embodiment, the eighth connection electrode 1570 may be connected to the initialization-voltage line and the third semiconductor pattern 1330 through contact holes. The eighth connection electrode 1570 of the first circuit area PCA1 may be connected to the first initialization-voltage line VL21, the eighth connection electrode 1570 of the second circuit area PCA2 may be connected to the second initialization-voltage line VL22, and the eighth connection electrode 1570 of the third circuit area PCA3 may be connected to the third initialization-voltage line VL23. The eighth connection electrode 1570 may connect the initialization-voltage line to the source region S4 of the fourth transistor T4.

Figure 11:
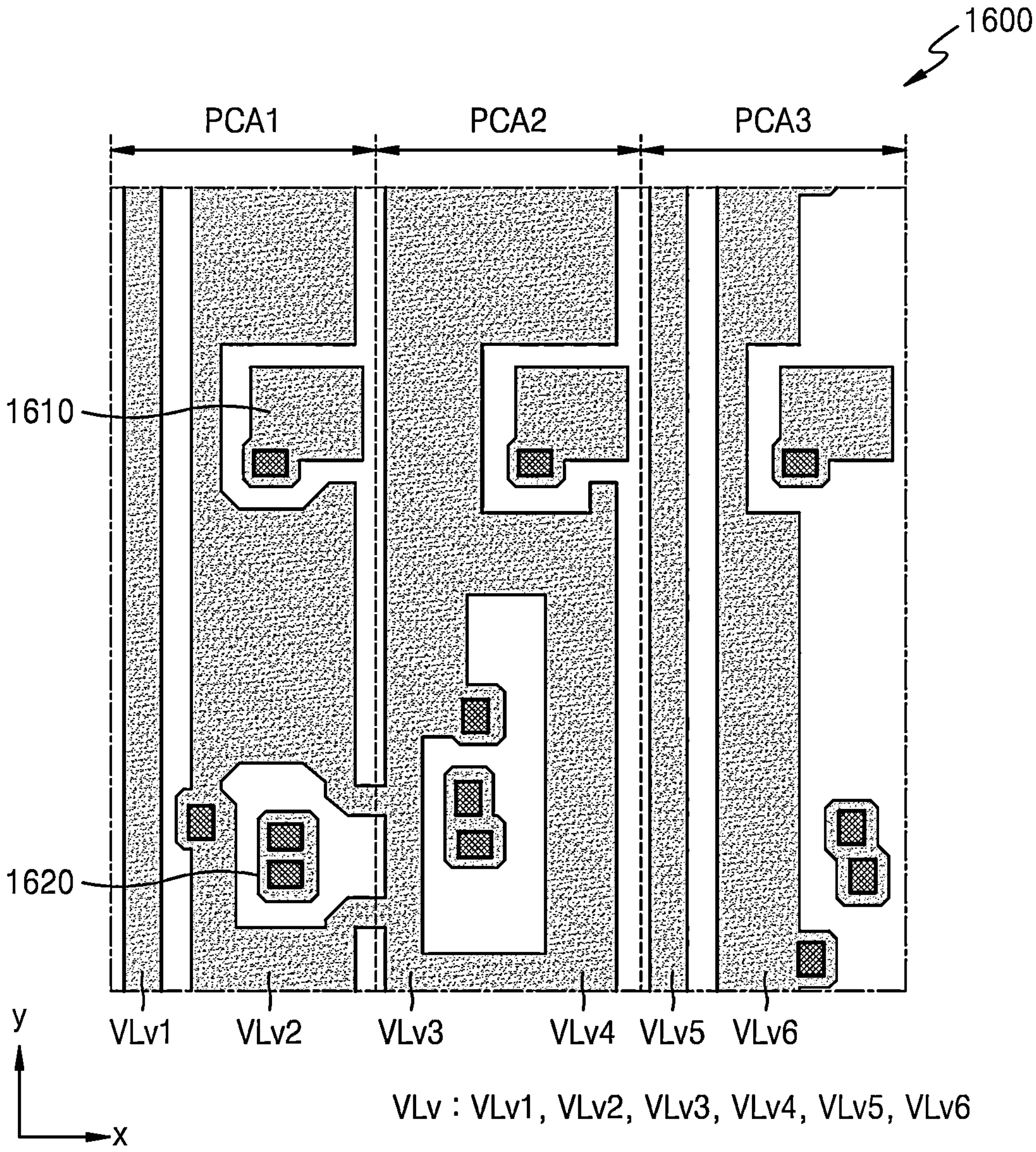
FIG. 11 is a layer-by-layer layout diagram schematically showing pixels, according to an embodiment.

In an embodiment, a fifth insulating layer may be disposed on the fourth conductive layer 1500, and a fifth conductive layer 1600 may be disposed on the fifth insulating layer, as shown in FIG. 11. The fifth conductive layer 1600 may include a plurality of vertical voltage lines VLv, a sixth conductive pattern 1610, and a ninth connection electrode 1620.

In an embodiment, the sixth conductive pattern 1610 may be of an island type and may be arranged in each of the first circuit area PCA1, the second circuit area PCA2, and the third circuit area PCA3. The sixth conductive pattern 1610 may overlap the fifth connection electrode 1530 and may be connected to the fifth conductive pattern 1540 through a contact hole.

In an embodiment, the ninth connection electrode 1620 may be connected to the seventh connection electrode 1560 through a contact hole. The ninth connection electrode 1620 may connect the pixel electrode of the organic light-emitting diode OLED to the drain region D4 of the fourth transistor T4 and the source region S6 of the sixth transistor T6 through the seventh connection electrode 1560.

In an embodiment, the vertical voltage lines VLv may extend in the second direction (y-direction) and two of them may be arranged in each of the first circuit area PCA1, the second circuit area PCA2, and the third circuit area PCA3.

Each of the odd-numbered voltage lines VLv1, VLv3, and VLv5 among the vertical voltage lines VLv may overlap the data line DL, and the even-numbered voltage lines VLv2, VLv4, and VLv6 among the vertical voltage lines VLv may overlap the first semiconductor pattern 1310. In an embodiment, some adjacent vertical voltage lines among the vertical voltage lines VLv may be provided as one body. For example, as shown in FIG. 11, the second vertical voltage line VLv2, the third vertical voltage line VLv3, and the fourth vertical voltage line VLv4 may be connected to each other by connection portions and provided as one body.

In an embodiment, some of the odd-numbered voltage lines VLv1, VLv3, and VLv5 may be shield lines that are not electrically connected to other wiring lines, semiconductor patterns, and conductive patterns within the display area DA. The shield lines may be connected, through a contact hole, to a voltage supply line placed in the peripheral area PA across the display area DA. In an embodiment, the voltage supply line may be a common-voltage supply line configured to transmit the second driving voltage ELVSS. In another embodiment, the voltage supply line may be a driving voltage supply line configured to transmit the first driving voltage ELVDD, a first initialization-voltage supply line configured to transmit the first initialization-voltage Vaint1, a second initialization-voltage supply line configured to transmit the second initialization-voltage Vaint2, or a third initialization-voltage supply line configured to supply the third initialization-voltage Vaint3.

In an embodiment, the vertical voltage lines VLv may respectively receive a plurality of voltages supplied to the pixels PXr, PXg, and PXb, for example, the first driving voltage ELVDD, the second driving voltage ELVSS, the reference voltage Vref, the first initialization-voltage Vaint1, the second initialization-voltage Vaint2, and the third initialization-voltage Vaint3. The vertical voltage lines VLv may be arranged in the first direction (x direction) according to a certain arrangement rule. The arrangement rule of the vertical voltage lines VLv are described below with reference to FIG. 15.

Figure 12:
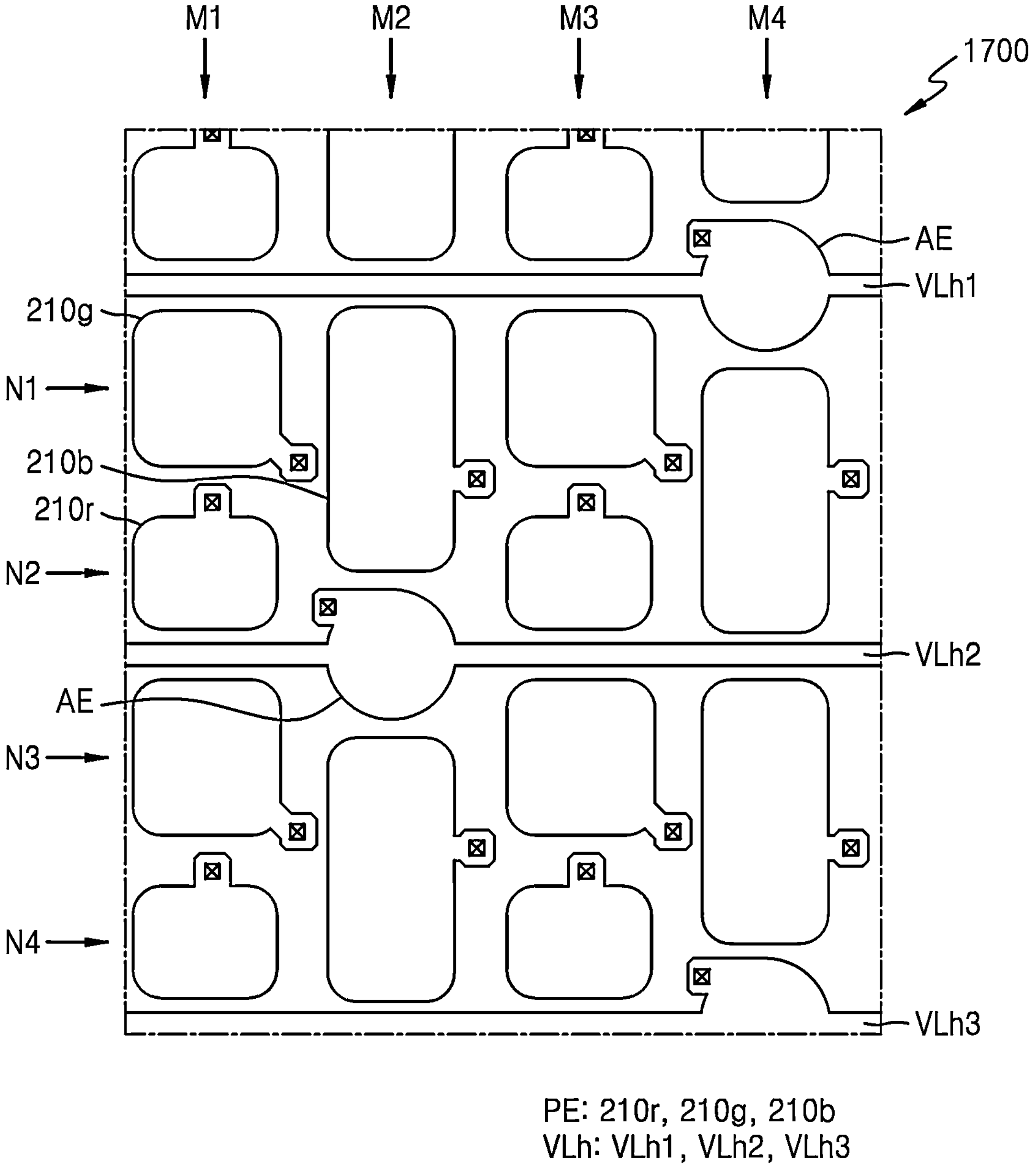
FIG. 12 is a layout diagram schematically showing the arrangement of pixel electrodes of pixels, according to an embodiment.

FIG. 12 is a layout diagram schematically showing the arrangement of pixel electrodes of pixels, according to an embodiment.

In an embodiment and referring to FIG. 12, a sixth insulating layer may be disposed on the fifth conductive layer 1600, and a sixth conductive layer 1700 may be disposed on the sixth insulating layer. The sixth conductive layer 1700 may include pixel electrodes PE, auxiliary electrodes AE, and horizontal voltage lines VLh.

In an embodiment, the pixel electrodes PE may include a first pixel electrode 210*r* included in the organic light-emitting diode OLED of the first pixel PXr, a second pixel electrode 210*g* included in the organic light-emitting diode OLED of the second pixel PXg, and a third pixel electrode 210*b* included in the organic light-emitting diode OLED of the third pixel PXb.

In an embodiment, the pixel electrodes PE may form rows and columns in the display area DA. The second pixel electrode 210*g* and the first pixel electrode 210*r* may be arranged in odd-numbered columns M1 and M3, and the third pixel electrodes 210*b* may be arranged in even-numbered columns M2 and M4. In the even-numbered columns M2 and M4, the auxiliary electrodes AE may be arranged between the third pixel electrodes 210*b*. The second pixel electrodes 210*g* may be arranged in odd-numbered rows N1 and N3, and the first pixel electrodes 210*r* may be arranged in even-numbered rows N2 and N4. The third pixel electrode 210*b* may have a long rectangular shape in the second direction (y direction) and may be arranged across an odd-numbered row and an even-numbered row, which are adjacent to each other.

In an embodiment, auxiliary electrodes AE that are disposed adjacent to each other in the first direction (x direction) may be connected by the horizontal voltage lines VLh. Some of the auxiliary electrodes AE may directly contact the opposite electrode of the organic light-emitting diode OLED through holes formed through a laser drilling process.

In an embodiment, the horizontal voltage lines VLh may extend in the first direction (x-direction) and may be arranged to be apart from each other at two row intervals. For example, the first row N1 and the second row N2 may be arranged between the first horizontal voltage line VLh1 and the second horizontal voltage line VLh2, and the third row N3 and the fourth row N4 may be arranged between the second horizontal voltage line VLh2 and the third horizontal voltage line VLh3.

In an embodiment, the horizontal voltage lines VLh may respectively receive a plurality of voltages supplied to the pixels PXr, PXg, and PXb, for example, the first driving voltage ELVDD, the second driving voltage ELVSS, the reference voltage Vref, the first initialization-voltage Vaint1, the second initialization-voltage Vaint2, and the third initialization-voltage Vaint3. Each of the horizontal voltage lines VLh may be connected to a corresponding vertical voltage line VLv through a contact hole within the display area DA to form a mesh structure.

Figure 13A:
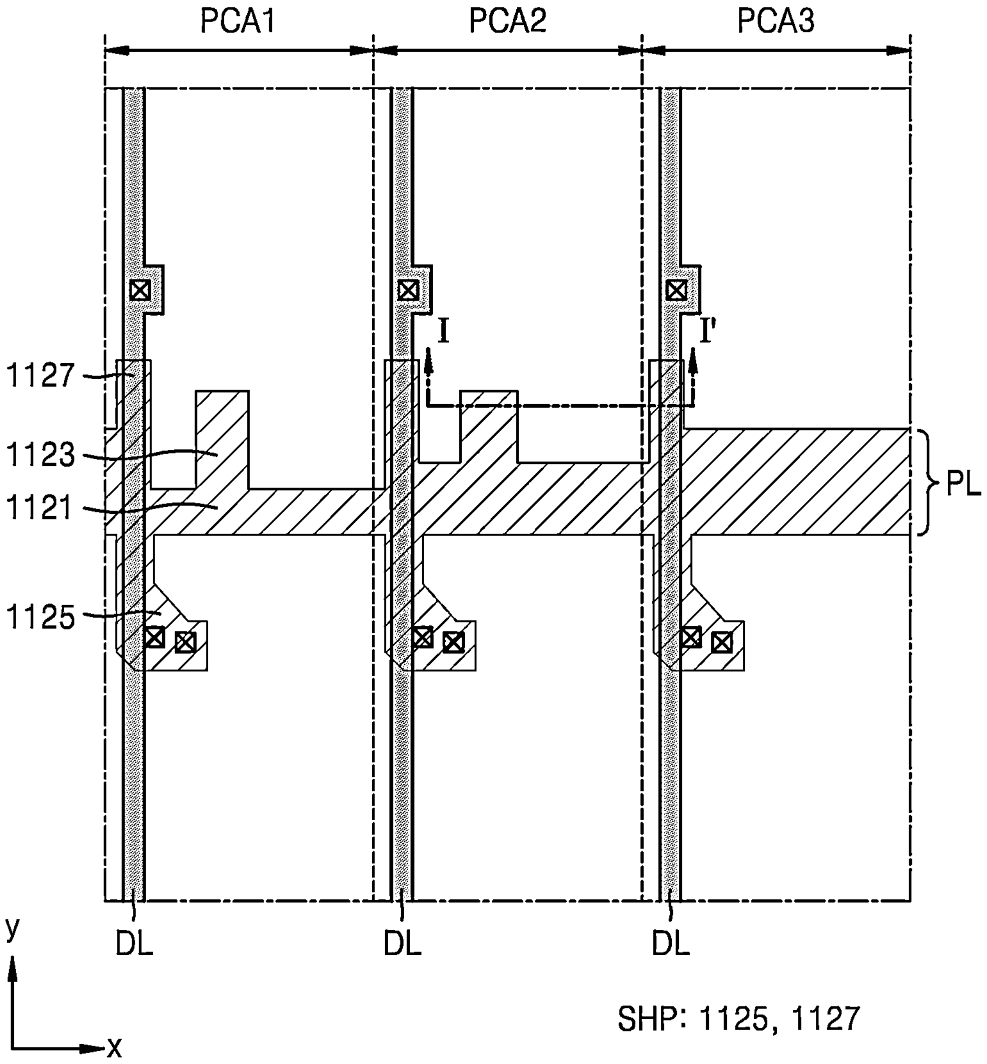
FIG. 13A is a diagram schematically showing a first voltage line and a data line, according to an embodiment.
Figure 13B:
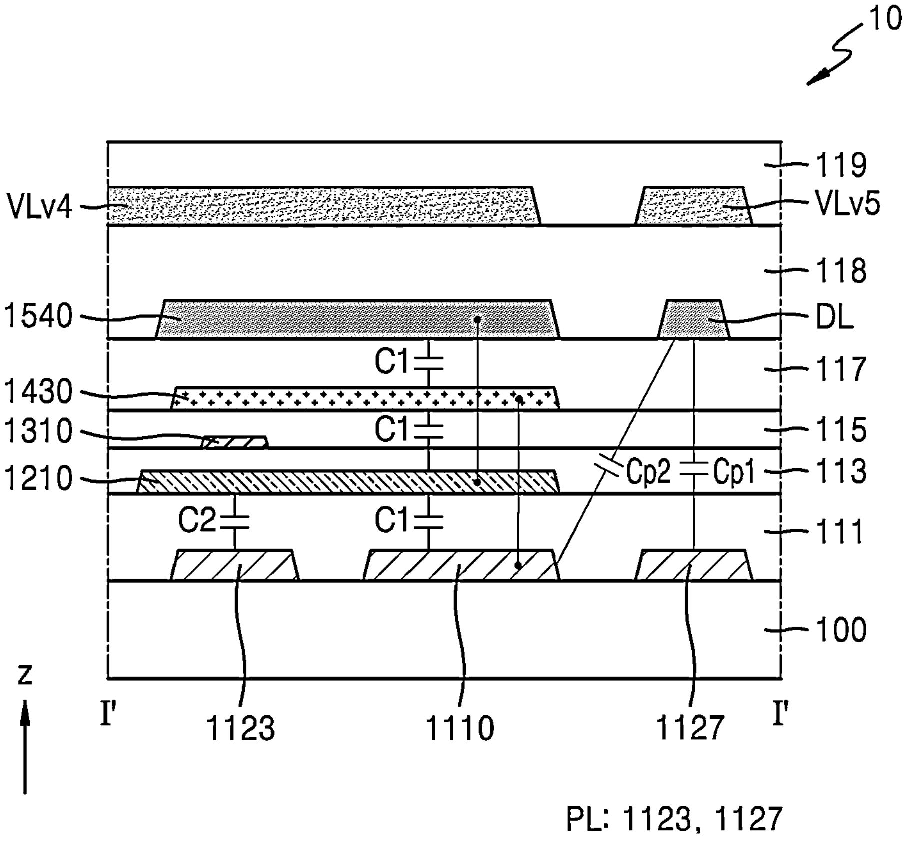
FIG. 13B is a diagram schematically showing a first voltage line and a data line, according to an embodiment.
Figure 14:
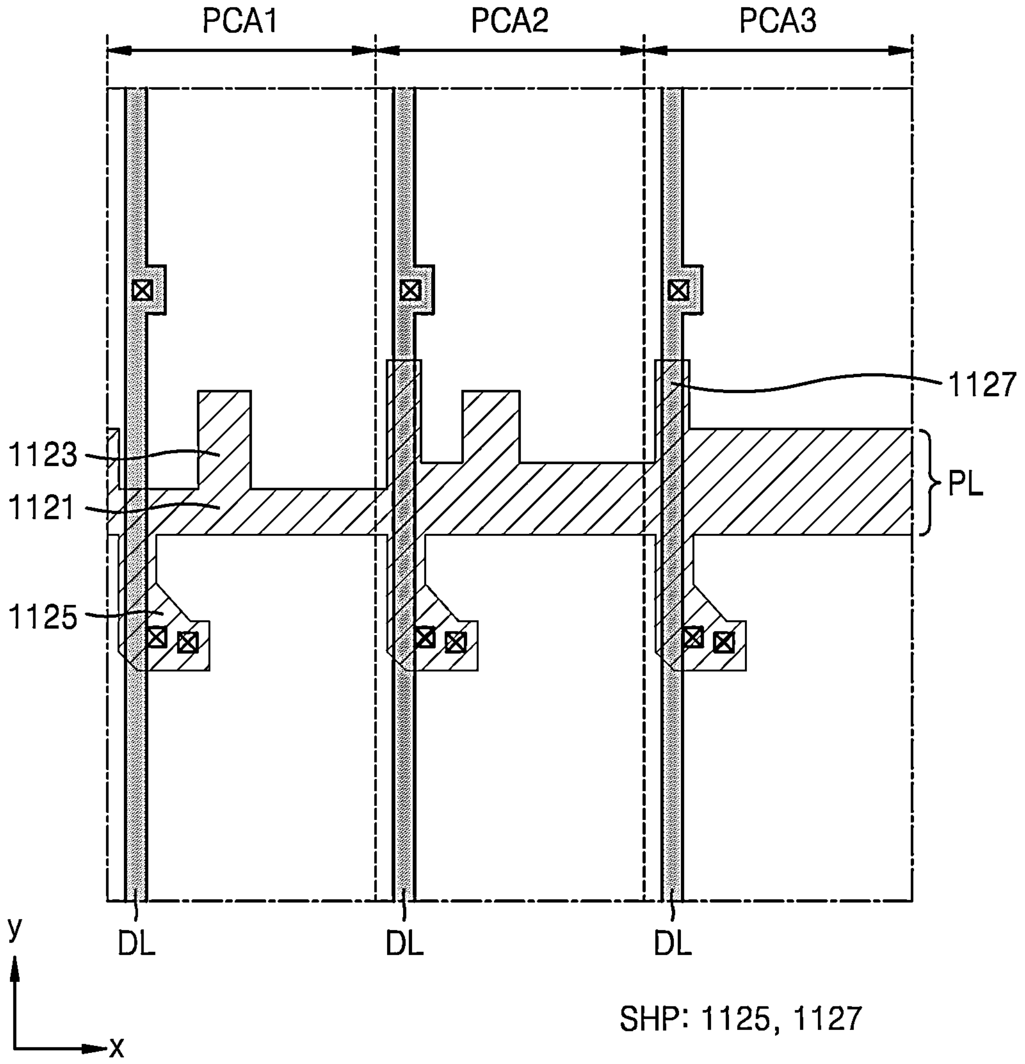
FIG. 14 is a diagram schematically showing a first voltage line and a data line, according to an embodiment.

FIGS. 13A, 13B, and 14 are diagrams schematically showing a first voltage line and a data line, according to an embodiment. FIGS. 13A and 14 are plan views schematically showing the driving voltage line PL and the data line DL for convenience of description, and FIG. 13B is a cross-sectional view schematically showing a cross-section taken along line I-I' of the display apparatus 10 shown in FIG. 13A.

In an embodiment and referring to FIG. 13A, the driving voltage line PL may extend in the first direction (x direction) and may cross the first circuit area PCA1, the second circuit area PCA2, and the third circuit area PCA3. The driving voltage line PL may include a body portion 1121 extending in the first direction (x direction) in each circuit area, an electrode portion 1123 protruding from the body portion 1121 in a second direction (y direction), and a shielding portion SHP protruding from the body portion 1121 in the second direction (y direction).

In an embodiment, the width of the body portion 1121 of the driving voltage line PL in the second direction (y direction) may be different in each circuit area. For example, the width of the body portion 1121 in the first circuit area PCA1 may be less than the width of the body portion 1121 in the second circuit area PCA2, and the width of the body portion 1121 in the second circuit area PCA2 may be less than the width of the body portion 1121 in the third circuit area PCA3.

In an embodiment, the electrode portion 1123 may protrude from the body portion 1121 in the second direction (y direction). The electrode portion 1123 may be arranged in each of the first circuit area PCA1 and the second circuit area PCA2. The electrode portion 1123 may not be arranged in the third circuit area PCA3.

In an embodiment, the shielding portion SHP may protrude from the body portion 1121 in the second direction (y direction). The shielding portion SHP may be apart from the electrode portion 1123 in the first direction (x direction). The shielding portion SHP may include a first shielding portion 1125 and a second shielding portion 1127, which extend in opposite directions. For example, the first shielding portion 1125 may extend in a −y direction, and the second shielding portion 1127 may extend in a +y direction. In an embodiment, the area of the shielding portion SHP may be substantially the same in each circuit area. For example, the shielding portion SHP of the first circuit area PCA1, the shielding portion SHP of the second circuit area PCA2, and the shielding portion SHP of the third circuit area PCA3 may each include a first shielding portion 1125 and a second shielding portion 1127.

In an embodiment, the data line DL may extend in the second direction (y-direction) and may be arranged in each of the first circuit area PCA1, the second circuit area PCA2, and the third circuit area PCA3. The data line DL may overlap the shielding portion SHP.

In an embodiment and referring to FIG. 13B, a driving voltage line PL and a first conductive pattern 1110 may be disposed on a substrate 100. The driving voltage line PL may include an electrode portion 1123 and a second shielding portion 1127.

In an embodiment, a first insulating layer 111 may be disposed on the driving voltage line PL and the first conductive pattern 1110, and a second conductive pattern 1210 may be disposed on the first insulating layer 111. The second conductive pattern 1210 may overlap the electrode portion 1123 and the first conductive pattern 1110. The electrode portion 1123 and a portion of the second conductive pattern 1210 that overlaps the electrode portion 1123 may form a second capacitor C2.

In an embodiment, a second insulating layer 113 may be disposed on the second conductive pattern 1210, and a first semiconductor pattern 1310 may be disposed on the second insulating layer 113. The first semiconductor pattern 1310 may overlap the electrode portion 1123.

In an embodiment, t third insulating layer 115 may be disposed on the first semiconductor pattern 1310. A fourth conductive pattern 1430 may be disposed on the third insulating layer 115. The fourth conductive pattern 1430 may overlap the second conductive pattern 1210. The fourth conductive pattern 1430 may be connected to the first conductive pattern 1110 through a contact hole passing through the first insulating layer 111, the second insulating layer 113, and the third insulating layer 115.

In an embodiment, a fourth insulating layer 117 may be disposed on the fourth conductive pattern 1430, and a fifth conductive pattern 1540 and a data line DL may be disposed on the fourth insulating layer 117. The fifth conductive pattern 1540 may overlap the fourth conductive pattern 1430. The fifth conductive pattern 1540 may be connected to the second conductive pattern 1210 through a contact hole passing through the third insulating layer 115 and the fourth insulating layer 117.

In an embodiment, the first conductive pattern 1110, the second conductive pattern 1210, the fourth conductive pattern 1430, and the fifth conductive pattern 1540 that overlap each other may form a first capacitor C1. For example, the sum of the capacitance between the first conductive pattern 1110 and the second conductive pattern 1210, the capacitance between the second conductive pattern 1210 and the fourth conductive pattern 1430, and the capacitance between the fourth conductive pattern 1430 and the fifth conductive pattern 1430 may be the total capacitance of the first capacitor C1.

In an embodiment, the data line DL may overlap the second shielding portion 1127 of the driving voltage line PL. A first parasitic capacitor Cp1 may be formed between the data line DL and the second shielding portion 1127, and a second parasitic capacitor Cp2 may be formed between the data line DL and the first conductive pattern 1110.

In an embodiment and as a comparative example, when the driving voltage line PL does not include the second shielding portion 1127, the capacitance of the second parasitic capacitor Cp2 between the data line DL and the first conductive pattern 1110 may increase, resulting in deterioration of front of screen (FOS) characteristics of the display apparatus. In addition, due to the coupling of the second parasitic capacitor Cp2, pixels connected to the same data line DL may emit light with a luminance that is different from a predetermined luminance, resulting in vertical line crosstalk in which line-shaped spots appear in images.

In an embodiment, the driving voltage line PL may include the second shielding portion 1127 overlapping the data line DL, and thus, the capacitance of the second parasitic capacitor Cp2 may be reduced by the first parasitic capacitor Cp1 formed by the data line DL and the second shielding portion 1127. Accordingly, the FOS characteristics of the display apparatus 10 may be improved, and the display apparatus 10 may display a high-quality image in which vertical line crosstalk is prevented or reduced.

In an embodiment, a fifth insulating layer 118 may be disposed on the fifth conductive pattern 1540 and the data line DL, and fourth and fifth vertical voltage lines VLv4 and VLv5 may be disposed on the fifth insulating layer 118. The fourth vertical voltage line VLv4 may overlap the first semiconductor pattern 1310 of the second circuit area PCA2, and the fifth vertical voltage line VLv5 may overlap the data line DL of the third circuit area PCA3.

In an embodiment, a sixth insulating layer 119 may be disposed on the fourth vertical voltage line VLv4 and the fifth vertical voltage line VLv5.

In an embodiment and referring to FIG. 14, the driving voltage line PL may not include the second shielding portion 1127 in any one of the first circuit area PCA1, the second circuit area PCA2, and the third circuit area PCA3. In relation to this, FIG. 14 shows that the driving voltage line PL does not include the second shielding portion 1127 in the first circuit area PCA1.

In an embodiment, the area of the shielding portion SHP in the first circuit area PCA1 may be different from the area of the shielding portion SHP in the second circuit area PCA2 and the area of the shielding portion SHP in the third circuit area PCA3. The area of the shielding portion SHP in the first circuit area PCA1 may be less than the area of the shielding portion SHP in the second circuit area PCA2 and the area of the shielding portion SHP in the third circuit area PCA3.

In an embodiment and as described above, the second shielding portion 1127 may form the first parasitic capacitor Cp1 together with the data line DL. When a data signal applied to the data line DL changes, the first driving voltage ELVDD of the driving voltage line PL may instantaneously change due to the coupling of the first parasitic capacitor Cp1. The voltage of the second terminal of the first transistor T1, that is, the voltage of the second node N2, may change due to the coupling of the second capacitor C2 connected to the driving voltage line PL, thereby changing the gate-source voltage of the first transistor T1. Accordingly, pixels connected to the same driving voltage line PL may emit light with a luminance that is different from a predetermined luminance, resulting in horizontal line crosstalk in which line-shaped spots appear in images.

In an embodiment, in order to prevent or reduce the horizontal line crosstalk, the second shielding portion 1127 of the driving voltage line PL may be omitted in one circuit area, thereby reducing the first parasitic capacitor Cp1 of a first pixel circuit. In an embodiment, the second shielding portion 1127 of the driving voltage line PL may be omitted in the first circuit area PCA1 where the pixel circuit of the first pixel PXr emitting red light is arranged.

TABLE 1

| image pattern | E1 | E2 | E3 | CE1 |
|---|---|---|---|---|
| black box | 0.24% | 0.28% | 0.32% | 0.35% |
| white box | 0.20% | 0.25% | 0.30% | 0.33% |

Table 1 shows the measured luminance deviation of pixels due to vertical line crosstalk of display apparatuses according to a first embodiment E1, a second embodiment E2, a third embodiment E3 and a comparative example CE1.

In the first embodiment E1, as shown in FIG. 13A, the shielding portion SHP of the first circuit area PCA1, the shielding portion SHP of the second circuit area PCA2, and the shielding portion SHP of the third circuit area PCA3 have the same area. In the second embodiment E2, as shown in FIG. 14, the second shielding portion 1127 of the first circuit area PCA1 is omitted, and the area of the shielding portion SHP of the first circuit area PCA1 is less than the area of the shielding portion SHP of the second circuit area PCA2 and the area of the shielding portion SHP of the third circuit area PCA3. In the third embodiment E3, the second shielding portion 1127 of the second circuit area PCA2 is omitted, and the area of the shielding portion SHP of the second circuit area PCA2 is less than the area of the shielding portion SHP of the first circuit area PCA1 and the area of the shielding portion SHP of the third circuit area PCA3. In the comparative example CE1, the driving voltage line PL includes the first shielding portion 1125 in each of the first to third circuit areas PCA1 to PCA3, respectively, but does not include the second shielding portion 1125.

In an embodiment and referring to Table 1, the luminance deviation due to vertical line crosstalk is lowest in the first embodiment E1 in which the second shielding portion 1127 is formed on the driving voltage line PL in all circuit areas. When one second shielding portion 1127 is omitted in consideration of horizontal line crosstalk, the luminance deviation of the second embodiment E2 in which the second shielding portion 1127 is omitted in the first circuit area PCA1 is less than the luminance deviation of the third embodiment E3 in which the second shielding portion 1127 is omitted in the second circuit area PCA2. That is, when the area of the shielding portion SHP overlapping the data line DL connected to the first pixel PXr is different from the area of the shielding portion SHP overlapping the data line DL connected to the second pixel PXg and the area of the shielding portion SHP overlapping the data line DL connected to the third pixel PXb, both of vertical line crosstalk and horizontal line crosstalk may be reduced.

Figure 15:
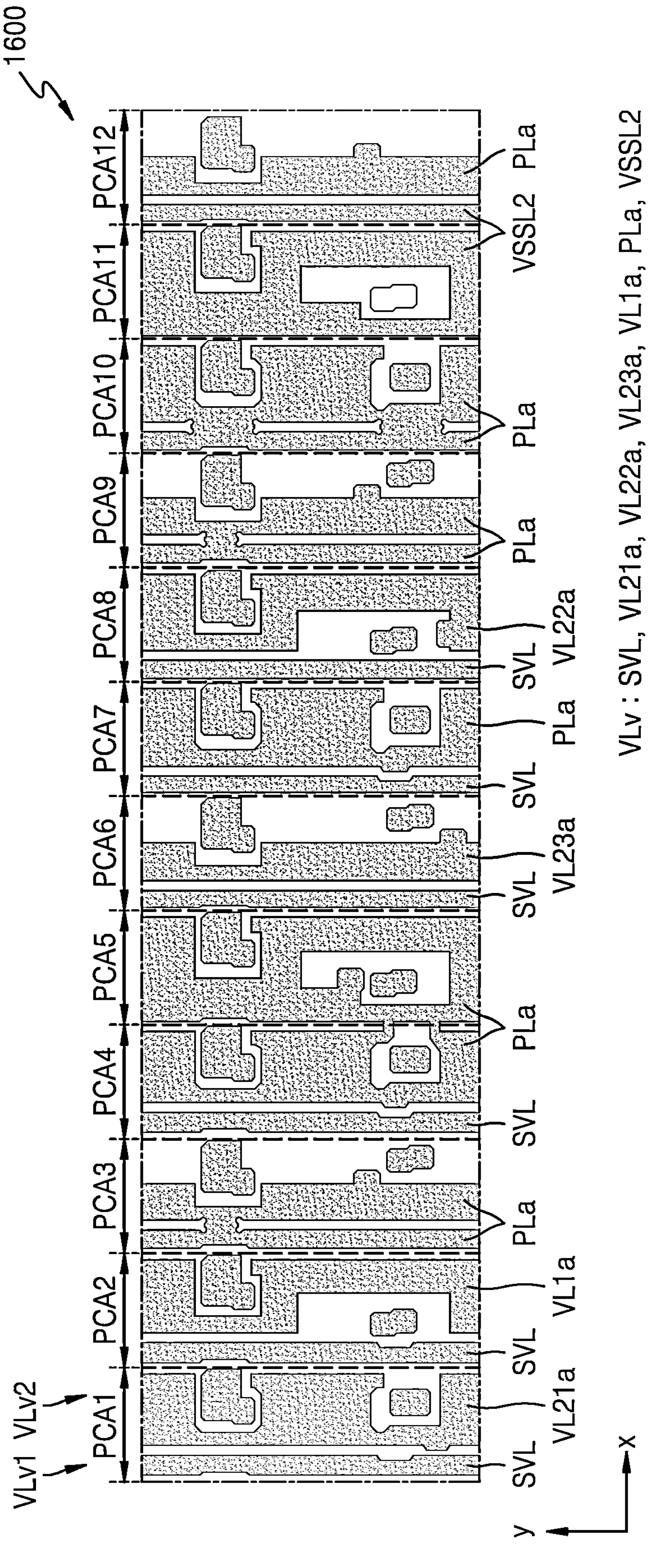
FIG. 15 is a layout diagram schematically showing the arrangement of vertical voltage lines, according to an embodiment.

FIG. 15 is a layout diagram schematically showing the arrangement of vertical voltage lines, according to an embodiment. FIG. 15 shows the fifth conductive layer 1600 wherein vertical voltage lines VLv are arranged.

In an embodiment and referring to FIG. 15, two vertical voltage lines VLv extending in the second direction (y direction) may be arranged in one pixel circuit. For example, a first vertical voltage line VLv1 overlapping a data line and a second vertical voltage line VLv2 overlapping a first semiconductor pattern may be arranged in the first circuit area PCA1. Some adjacent vertical voltage lines among the vertical voltage lines VLv may be connected to each other and provided as one body.

In an embodiment, the vertical voltage lines VLv may be arranged in the first direction (x direction) according to a certain rule. In an embodiment, the vertical voltage lines VLv may be repeatedly arranged in units of 12 circuit areas (i.e., first to twelfth circuit areas PCA1, PCA2, . . . , and PCA12, respectively). In this case, a pixel circuit of the first pixel PXr emitting red light may be arranged in the first circuit area PCA1, the fourth circuit area PCA4, the seventh circuit area PCA7, and the tenth circuit area PCA10, a pixel circuit of the second pixel PXg emitting green light may be arranged in the second circuit area PCA2, the fifth circuit area PCA5, the eighth circuit area PCA8, and the eleventh circuit area PCA11, and a pixel circuit of the third pixel PXb emitting blue light may be arranged in the third circuit area PCA3, the sixth circuit area PCA6, the ninth circuit area PCA9, and the twelfth circuit area PCA12.

In an embodiment, a shield line SVL and a first auxiliary initialization-voltage line VL21*a* may be arranged in the first circuit area PCA1, a shield line SVL and an auxiliary reference voltage line VL1*a* may be arranged in the second circuit area PCA2, and an auxiliary driving voltage line PLa may be arranged in the third circuit area PCA3. A shield line SVL and an auxiliary driving voltage line PLa may be arranged in the fourth circuit area PCA4, an auxiliary driving voltage line PLa may be arranged in the fifth circuit area PCA5, and a shield line SVL and a third auxiliary initialization-voltage line VL23*a* may be arranged in the sixth circuit area PCA6. A shield line SVL and an auxiliary driving voltage line PLa may be arranged in the seventh circuit area PCA7, a shield line SVL and a second auxiliary initialization-voltage line VL22*a* may be arranged in the eighth circuit area PCA8, and an auxiliary driving voltage line PLa may be arranged in the ninth circuit area PCA9. An auxiliary driving voltage line PLa may be arranged in the tenth circuit area PCA10, an auxiliary common-voltage line VSSL2 may be arranged in the eleventh circuit area PCA11, and an auxiliary common-voltage line VSSL2 and an auxiliary driving voltage line PLa may be arranged in the twelfth circuit area PCA12.

In an embodiment, the shield line SVL may be a wiring line to which a shielding voltage is applied and may be a wiring line that is not electrically connected to other wiring lines, semiconductor patterns, and conductive patterns within the display area DA. The shield line SVL may be connected to a voltage supply line arranged in the peripheral area PA across the display area DA.

Because the shield line SVL is not connected to wiring lines extending in the first direction (x direction) within the display area DA, the influence of changes in the data signal may not be transmitted to surrounding pixels. Accordingly, in an embodiment, the display apparatus may reduce or prevent multi-line horizontal crosstalk by providing the shield line SVL that overlaps a data line.

In an embodiment, the voltage supply line connected to the shield line SVL may be a common-voltage supply line configured to transmit the second driving voltage ELVSS. In another embodiment, the voltage supply line may be a first driving voltage supply line configured to transmit the first driving voltage ELVDD, a first initialization-voltage supply line configured to transmit the first initialization-voltage Vaint1, a second initialization-voltage supply line configured to transmit the second initialization-voltage Vaint2, or a third initialization-voltage supply line configured to supply a third initialization-voltage Vaint3.

In an embodiment, the auxiliary driving voltage line PLa may be a wiring line configured to transmit the first driving voltage ELVDD. The auxiliary driving voltage line PLa may be connected, through a contact hole, to the sixth connection electrode 1550 overlapping the auxiliary driving voltage line PLa. The auxiliary driving voltage line PLa may form a mesh structure in the display area DA together with the driving voltage line PL.

In an embodiment, the first auxiliary initialization-voltage line VL21*a* may be a wiring line configured to transmit the first initialization-voltage Vaint1. The first auxiliary initialization-voltage line VL21*a* may be connected, through a contact hole, to the eighth connection electrode 1570 overlapping the first auxiliary initialization-voltage line VL21*a*. The first auxiliary initialization-voltage line VL21*a* may form a mesh structure in the display area DA together with the first initialization-voltage line VL21.

In an embodiment, the second auxiliary initialization-voltage line VL22*a* may be a wiring line configured to transmit the second initialization-voltage Vaint2. The second auxiliary initialization-voltage line VL22*a* may be connected, through a contact hole, to the eighth connection electrode 1570 overlapping the second auxiliary initialization-voltage line VL22*a*. The second auxiliary initialization-voltage line VL22*a* may form a mesh structure in the display area DA together with the second initialization-voltage line VL22.

In an embodiment, the third auxiliary initialization-voltage line VL23*a* may be a wiring line configured to transmit the third initialization-voltage Vaint3. The third auxiliary initialization-voltage line VL23*a* may be connected, through a contact hole, to the eighth connection electrode 1570 overlapping the third auxiliary initialization-voltage line VL23*a*. The third auxiliary initialization-voltage line VL23*a* may form a mesh structure in the display area DA together with the third initialization-voltage line VL23.

In an embodiment, the auxiliary reference voltage line VL1*a* may be a wiring line configured to transmit the reference voltage Vref. The auxiliary reference voltage line VL1*a* may be connected, through a contact hole, to the fourth connection electrode 1520 overlapping the auxiliary reference voltage line VL1*a*. The auxiliary reference voltage line VL1*a* may form a mesh structure in the display area DA together with the reference voltage line VL1.

In an embodiment, the auxiliary common-voltage line VSSL2 may be a wiring line configured to transmit the second driving voltage ELVSS. The auxiliary common-voltage line VSSL2 may be connected to the first horizontal voltage line VLh1 through a contact hole. The auxiliary common-voltage line VSSL2 may form a mesh structure in the display area DA together with the first horizontal voltage line VLh1.

Figure 16:
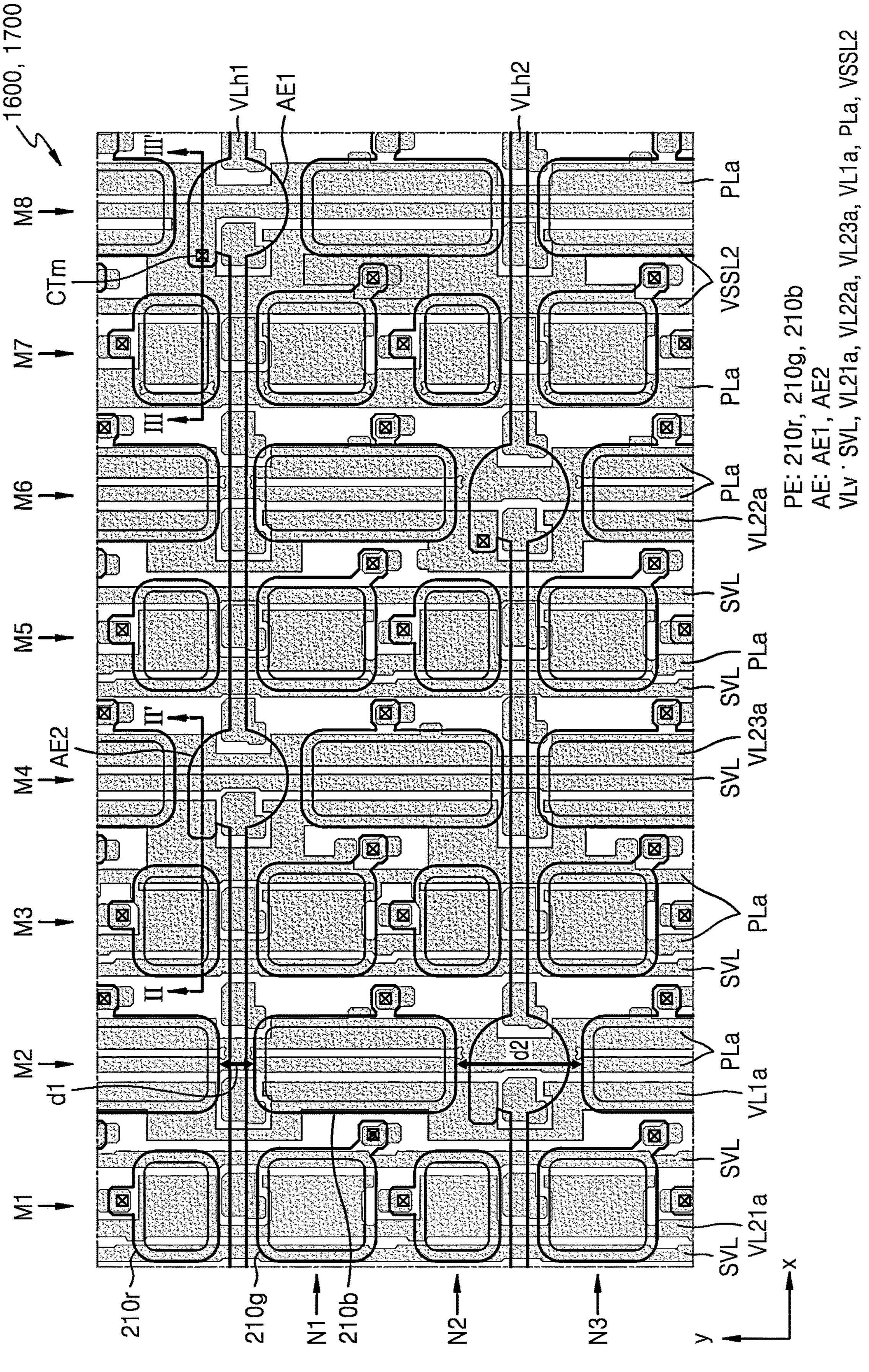
FIG. 16 is a layout diagram schematically showing the arrangement of pixels and voltage lines, according to an embodiment.
Figure 17A:
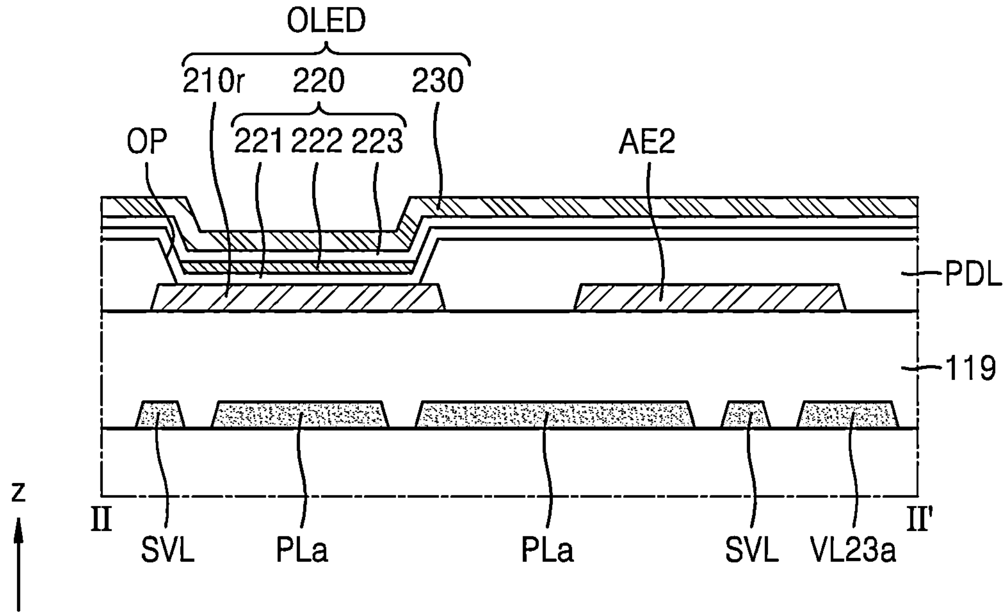
FIG. 17A is a cross-sectional view schematically showing pixels and voltage lines, according to an embodiment.
Figure 17B:
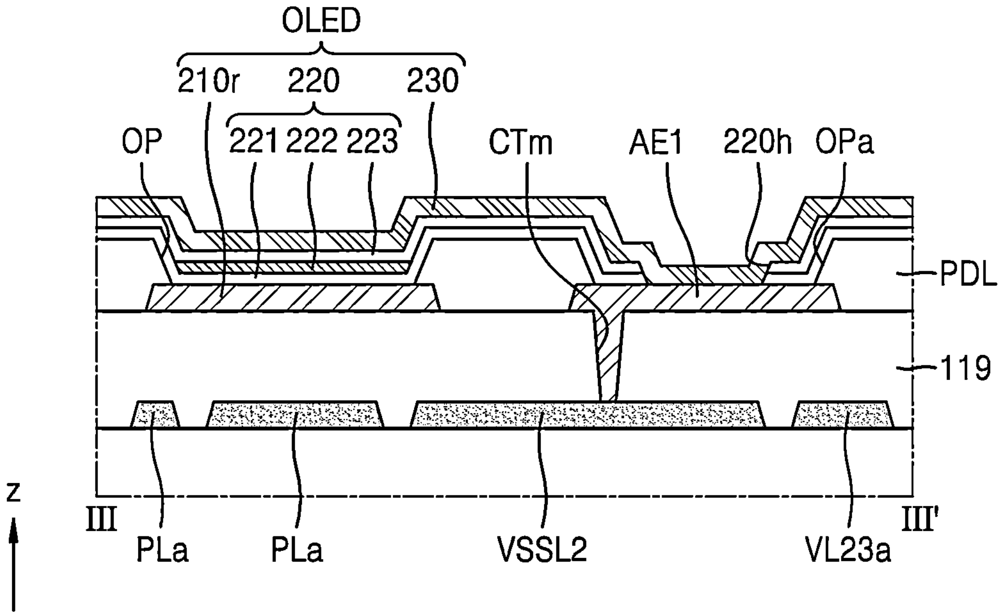
FIG. 17B is a cross-sectional view schematically showing pixels and voltage lines, according to an embodiment.

FIG. 16 is a layout diagram schematically showing the arrangement of pixels and voltage lines, according to an embodiment, and FIGS. 17A and 17B are cross-sectional views schematically showing pixels and voltage lines, according to an embodiment.

In an embodiment, FIG. 16 shows a fifth conductive layer 1600 on which vertical voltage lines VLv are arranged and a sixth conductive layer 1700 on which pixel electrodes 210*r*, 210*g*, and 210*b* are arranged. FIG. 17A shows a cross-section of a display apparatus taken along line II-II' in FIG. 16, and FIG. 17B shows a cross-section of the display apparatus taken along line III-III' in FIG. 16.

In an embodiment and referring to FIGS. 16, 17A, and 17B, a sixth insulating layer 119 may be disposed on the fifth conductive layer 1600, and the sixth conductive layer 1700 may be disposed on the sixth insulating layer 119.

In an embodiment, the fifth conductive layer 1600 may include a shield line SVL, a first auxiliary initialization-voltage line VL21*a*, a second auxiliary initialization-voltage line VL22*a*, a third auxiliary initialization-voltage line VL23*a*, an auxiliary reference voltage line VL1*a*, an auxiliary driving voltage line PLa, and an auxiliary common-voltage line VSSL2, which are arranged according to a certain rule.

In an embodiment, the sixth conductive layer 1700 may include pixel electrodes PE and auxiliary electrodes AE.

In an embodiment, the pixel electrodes PE may include a first pixel electrode 210*r* included in the organic light-emitting diode OLED of the first pixel PXr, a second pixel electrode 210*g* included in the organic light-emitting diode OLED of the second pixel PXg, and a third pixel electrode 210*b* included in the organic light-emitting diode OLED of the third pixel PXb. The organic light-emitting diode OLED may further include an opposite electrode 230 disposed on the pixel electrode PE and an intermediate layer 220 between the pixel electrode PE and the opposite electrode 230.

In an embodiment, a pixel-defining layer PDL may be disposed on the sixth conductive layer 1700 to cover the edge of each of the pixel electrodes PE. The pixel-defining layer PDL may define a pixel opening OP exposing a central portion of each of the pixel electrodes PE and an auxiliary opening OPa exposing a central portion of a first auxiliary electrode AE1. The emission area of the organic light-emitting diode OLED, that is, the size and shape of each pixel, may be defined by the pixel opening OP.

In an embodiment, the pixel-defining layer PDL may prevent arcs from occurring at the edges of the pixel electrodes PE by increasing the distance between the edge of each of the pixel electrodes PE and the opposite electrode 230.

In an embodiment, the intermediate layer 220 may include an emission layer 222 formed to correspond to each of the pixel electrodes PE. The emission layer 222 may include a high-molecular material or a low-molecular material and may emit red, green, blue, or white light. A first functional layer 221 and a second functional layer 223 may be disposed below and/or above the emission layer 222, respectively. The first functional layer 221 may be a hole transport layer (HTL). In another embodiment, the first functional layer 221 may include a hole injection layer (HIL) and an HTL. The second functional layer 223 may include an electron transport layer (ETL) and/or an electron injection layer (EIL). The first functional layer 221 and the second functional layer 223 may be integrally formed as one body to correspond to a plurality of organic light-emitting diodes OLED included in the display area DA.

In an embodiment, the opposite electrode 230 may include a conductive material having a relatively low work function. The opposite electrode 230 may be integrally formed as one body to correspond to a plurality of organic light-emitting diodes OLED included in the display area DA.

In an embodiment, the pixel electrodes PE may form rows and columns in the display area DA. The second pixel electrodes 210*g* and the first pixel electrodes 210*r* may be arranged in odd-numbered columns M1, M3, . . . , and the third pixel electrodes 210*b* may be arranged in even-numbered columns M2, M4, . . . . In the even-numbered columns M2, M4, . . . , the auxiliary electrodes AE may be arranged between the third pixel electrodes 210*b*. Third pixel electrodes 210*b* disposed adjacent to each other in the second direction (y direction) may be arranged to be spaced apart from each other by a first distance d1 or a second distance d2. The first distance d1 may be less than the second distance d2. The auxiliary electrodes AE may be arranged between the third pixel electrodes 210*b* that are apart from each other by the second distance d2.

In an embodiment, auxiliary electrodes AE disposed adjacent to each other in the first direction (x direction) may be connected to each other by horizontal voltage lines VLh1 and VLh2. The horizontal voltage lines VLh1 and VLh2 may extend only in the first direction (x direction). The auxiliary electrodes AE may include a first auxiliary electrode AE1 connected to a lower vertical voltage line through a contact hole CTm and a second auxiliary electrode AE2 in which no contact hole CTm is formed. In an embodiment, the first auxiliary electrode AE1 may be an auxiliary electrode that overlaps the auxiliary common-voltage line VSSL2 from among the auxiliary electrodes AE.

In an embodiment and as shown in FIG. 17B, the first auxiliary electrode AE1 may be connected to the auxiliary common-voltage line VSSL2 located below the first auxiliary electrode AE1 through the contact hole CTm passing through the sixth insulating layer 119. On the other hand, as shown in FIG. 17A, the second auxiliary electrode AE2 may be spaced apart from the auxiliary driving voltage line PLa, the shield line SVL, and the third auxiliary initialization-voltage line VL23*a* by the sixth insulating layer 119.

In an embodiment, the pixel-defining layer PDL may expose the upper surface of the first auxiliary electrode AE1 through the auxiliary opening OPa. An intermediate layer 220 may be disposed on the exposed upper surface of the first auxiliary electrode AE1, and the intermediate layer 220 may define a hole 220*h* that overlaps the first auxiliary electrode AE1. In an embodiment, the hole 220*h* of the intermediate layer 220 may be formed through a laser drilling process. The opposite electrode 230 may be in direct contact with the first auxiliary electrode AE1 through the hole 220*h* of the intermediate layer 220. Accordingly, the opposite electrode 230 may receive the second driving voltage ELVSS through the auxiliary common-voltage line VSSL2 and the first horizontal voltage line VLh1. On the other hand, the pixel-defining layer PDL may completely cover the second auxiliary electrode AE2, and the second auxiliary electrode AE2 may not be in contact with the opposite electrode 230 due to the pixel-defining layer PDL and the intermediate layer 220.

Figure 18A:
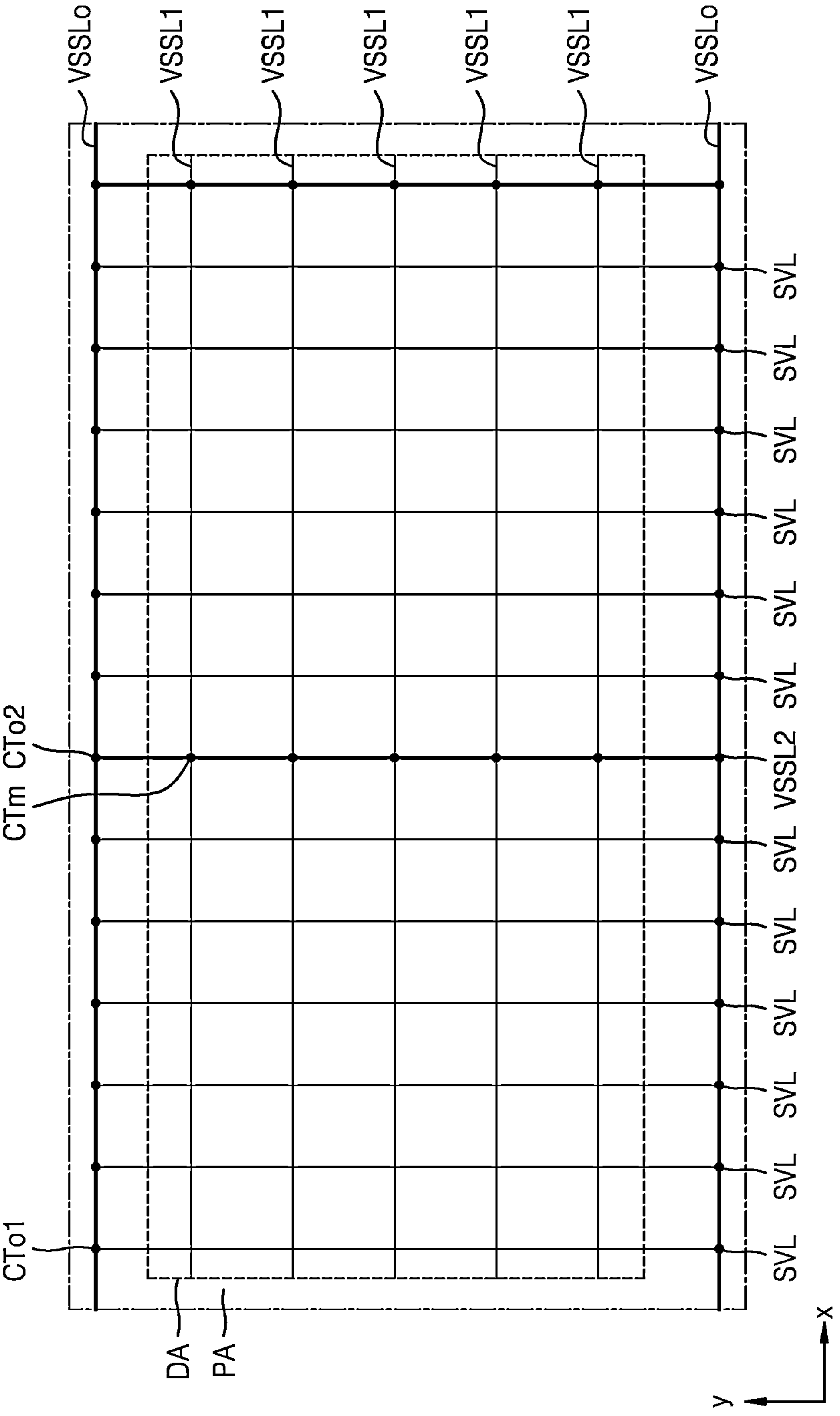
FIG. 18A is a diagram schematically showing voltage lines, according to an embodiment.
Figure 18B:
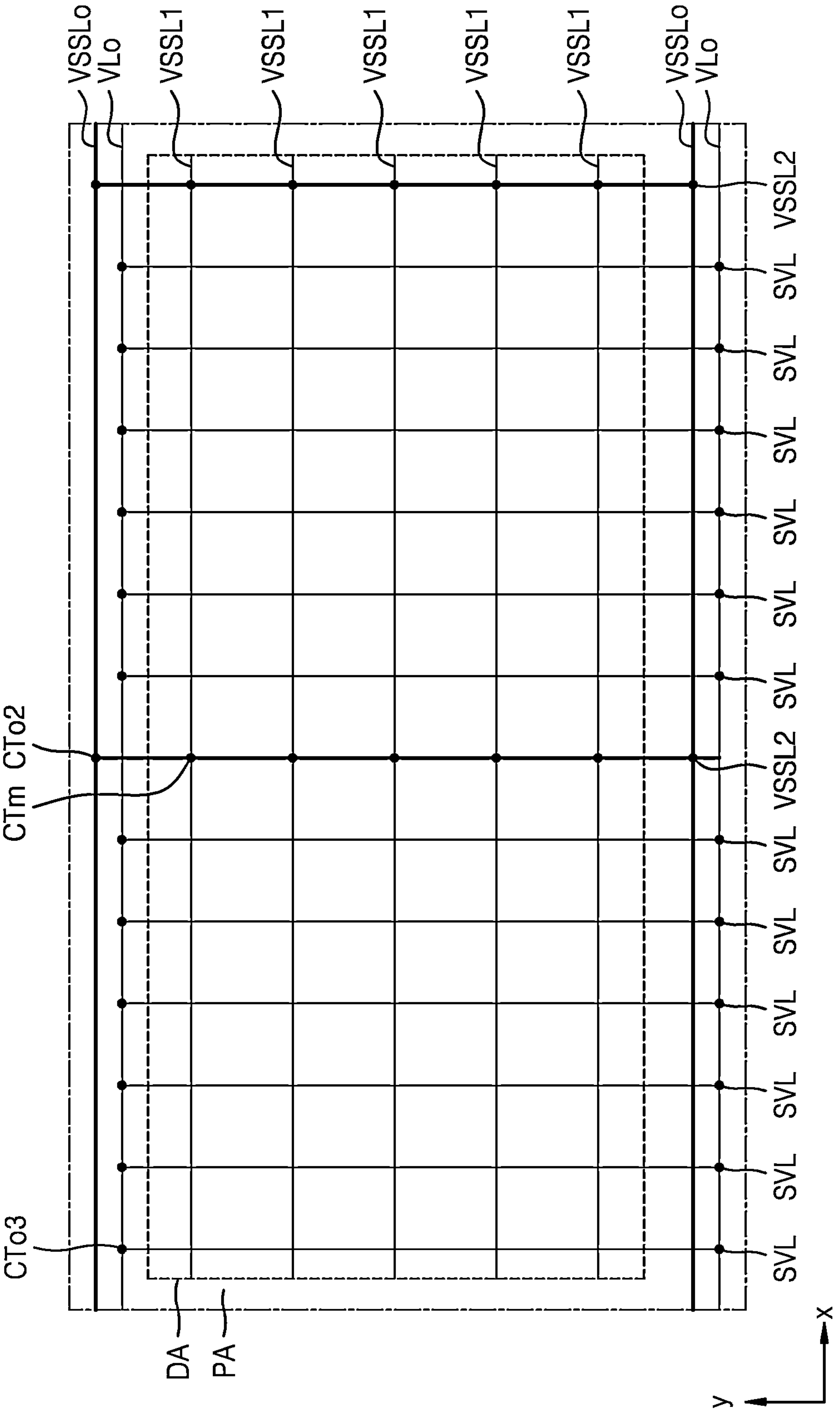
FIG. 18B is a diagram schematically showing voltage lines, according to an embodiment.

FIGS. 18A and 18B are diagrams schematically showing voltage lines, according to an embodiment.

In an embodiment, FIGS. 18A and 18B show 12 shield lines SVL, 2 auxiliary common-voltage lines VSSL2, and 5 common-voltage lines VSSL1, which are spaced apart from each other at regular intervals, for convenience of description and illustration. However, the invention is not limited thereto. The number of wiring lines arranged in the display area DA may increase, and the spacing between the wiring lines may also vary.

In an embodiment and referring to FIGS. 18A and 18B, a common-voltage line VSSL1, which extends in the first direction (x direction), and a shield line SVL and an auxiliary common-voltage line VSSL2, which extend in the second direction (y direction), may be arranged in a display area DA. The common-voltage line VSSL1 may be the first horizontal voltage line VLh1 shown in FIG. 17.

In an embodiment, common-voltage supply lines VSSLo extending in the first direction (x direction) may be arranged in a peripheral area PA outside the display area DA. In an embodiment, the common-voltage supply line VSSLo may be disposed on the upper side (+y direction side) and the lower side (−y direction side) of the peripheral area PA with the display area DA therebetween. The common-voltage supply line VSSLo may be a wiring line configured to transmit the second driving voltage ELVSS.

In an embodiment, the shield lines SVL may be vertical voltage lines arranged to overlap data lines and may not be electrically connected to other wiring lines, semiconductor patterns, and conductive patterns in the display area DA. The shield lines SVL may be connected to a voltage supply line located in the peripheral area PA outside the display area DA and receive a shielding voltage.

In an embodiment, as shown in FIG. 18A, the shield lines SVL may be connected to the common-voltage supply lines VSSLo through a contact hole CTo1 located in the peripheral area PA.

In an embodiment, the auxiliary common-voltage lines VSSL2 may be connected to the common-voltage supply lines VSSLo through a contact hole CTo2 located in the peripheral area PA and may be connected to the common-voltage lines VSSL1 through a contact hole CTm located in the display area DA. In the display area DA, the auxiliary common-voltage lines VSSL2 and the common-voltage lines VSSL1 may be connected to each other to form a mesh structure. The common-voltage lines VSSL1 may be connected to the opposite electrode 230 through the first auxiliary electrode AE1 and transmit the second driving voltage ELVSS to the opposite electrode 230. The shield line SVL may be apart from the common-voltage line VSSL1 in a thickness direction (z direction) by at least one insulating layer.

In an embodiment, as shown in FIG. 18B, the display apparatus 10 may further include voltage supply lines VLo extending in the first direction (x direction) in the peripheral area PA, and the shield lines SVL may be connected to the voltage supply lines VLo through a contact hole CTo3 located in the peripheral area PA. The voltage supply lines VLo may be disposed on the upper side (+y direction side) and the lower side (−y direction side) of the peripheral area PA with the display area DA therebetween.

In an embodiment, the voltage supply line VLo may be a first driving voltage supply line configured to transmit the first driving voltage ELVDD, a first initialization-voltage supply line configured to transmit the first initialization-voltage Vaint1, a second initialization-voltage supply line configured to transmit the second initialization-voltage Vaint2, or a third initialization-voltage supply line configured to supply a third initialization-voltage Vaint3. In another embodiment, the voltage supply line VLo may be a power line configured to supply a separate shielding voltage.

According to an embodiment, because the shield line SVL is not connected to wiring lines extending in the first direction (x direction) within the display area DA, the influence of changes in the data signal may not be transmitted to surrounding pixels. Accordingly, the display apparatus may reduce or prevent multi-line horizontal crosstalk by providing the shield line SVL that overlaps a data line.

FIGS. 19A to 20B are cross-sectional views showing a structure of a display element, according to an embodiment.

In an embodiment, an organic light-emitting diode OLED as the display element may include a pixel electrode 210, an opposite electrode 230, and an intermediate layer 220*m* disposed between the pixel electrode 210 (an anode) and the opposite electrode 230 (a cathode).

In an embodiment, the pixel electrode 210 may include a transmissive conductive oxide, such as indium tin oxide (ITO), indium zinc oxide (IZO), zinc oxide (ZnO), indium oxide (In2O3), indium gallium oxide (IGO), or aluminum zinc oxide (AZO). The pixel electrode 210 may include a reflective layer including Ag, Mg, Al, Pt, Pd, Au, Ni, Nd, Ir, Cr, or a compound thereof. For example, the pixel electrode 210 may have a triple-layered structure including ITO/Ag/ITO layers.

In an embodiment, the opposite electrode 230 may be arranged on the intermediate layer 220*m*. The opposite electrode 230 may include a metal having a low work function, an alloy, an electrically conductive compound, or an arbitrary combination thereof. For example, the opposite electrode 230 may include Li, Ag, Mg, Al, Al—Li, Ca, Mg—In, Mg—Ag, Yb, Ag—Yb, ITO, IZO, or an arbitrary combination thereof. The opposite electrode 230 may include a transmissive electrode, a transflective electrode, or a reflection electrode.

In an embodiment, the intermediate layer 220*m* may include a high molecular-weight organic material or a low molecular-weight organic material emitting a certain color of light. The intermediate layer 220*m* may further include a metal-containing compound, such as an organic metal compound, and an inorganic material, such as quantum dots, in addition to various organic materials.

In an embodiment, the intermediate layer 220*m* may include one emission layer and a first functional layer and a second functional layer below and above the emission layer, respectively. The first functional layer may include, for example, a hole transport layer HTL, or a hole transport layer HTL and a hole injection layer HIL. The second functional layer may include an electron transport layer ETL and/or an electron injection layer EIL. The first functional layer or the second functional layer may be omitted. The first functional layer and the second functional layer may be integrally formed to correspond to the plurality of organic light-emitting diodes OLEDs included in the display area DA.

In an embodiment, the intermediate layer 220*m* may include at least two emitting units and a charge generation layer CGL, wherein the at least two emitting units may be sequentially stacked between the pixel electrode 210 and the opposite electrode 230, and the charge generation layer CGL may be arranged between the at least two emitting units. When the intermediate layer 220*m* includes the emitting unit and the charge generation layer CGL, the organic light-emitting diode OLED may be a tandem light-emitting device. When the organic light-emitting diode OLED has the stacked structure of the plurality of emitting units, the organic light-emitting diode OLED may have improved color purity and emission efficiency.

In an embodiment, one emitting unit may include an emission layer and a first functional layer and a second functional layer below and above the emission layer, respectively. The charge generation layer CGL may include a negative charge generation layer and a positive charge generation layer. Based on the negative charge generation layer and the positive charge generation layer, the emission efficiency of the organic light-emitting diode OLED, which is the tandem light-emitting device including the plurality of emission layers, may be further increased.

In an embodiment, the negative charge generation layer may be an n-type charge generation layer. The negative charge generation layer may supply electrons. The negative charge generation layer may include a host and a dopant. The host may include an organic material. The dopant may include a metal material. The positive charge generation layer may be a p-type charge generation layer. The positive charge generation layer may supply holes. The positive charge generation layer may include a host and a dopant. The host may include an organic material. The dopant may include a metal material.

Figure 19A:
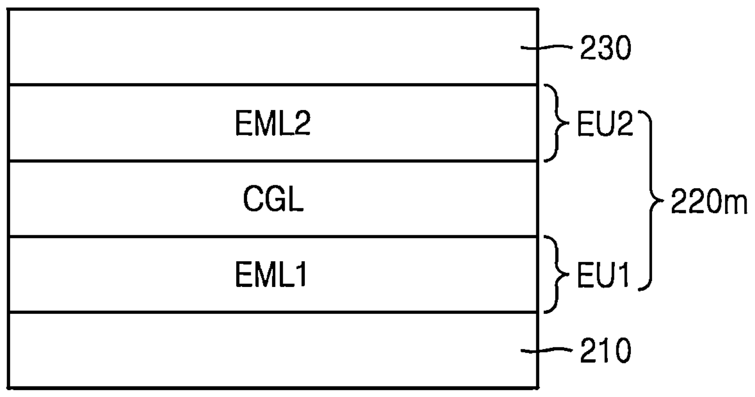
FIG. 19A is a cross-sectional view showing a structure of a display element, according to an embodiment.

In an embodiment, as illustrated in FIG. 19A, the organic light-emitting diode OLED may include a first emitting unit EU1 including a first emission layer EML1 and a second emitting unit EU2 including a second emission layer EML2, the first emitting unit EU1 and the second emitting unit EU2 being sequentially stacked. The charge generation layer CGL may be provided between the first emitting unit EU1 and the second emitting unit EU2. For example, the organic light-emitting diode OLED may include the pixel electrode 210, the first emission layer EML1, the charge generation layer CGL, the second emission layer EML2, and the opposite electrode 230 that are sequentially stacked. The first functional layer and the second functional layer may be included below and above the first emission layer EML1, respectively. The first functional layer and the second functional layer may be included below and above the second emission layer EML2, respectively. The first emission layer EML1 may be a blue emission layer, and the second emission layer EML2 may be a yellow emission layer.

Figure 19B:
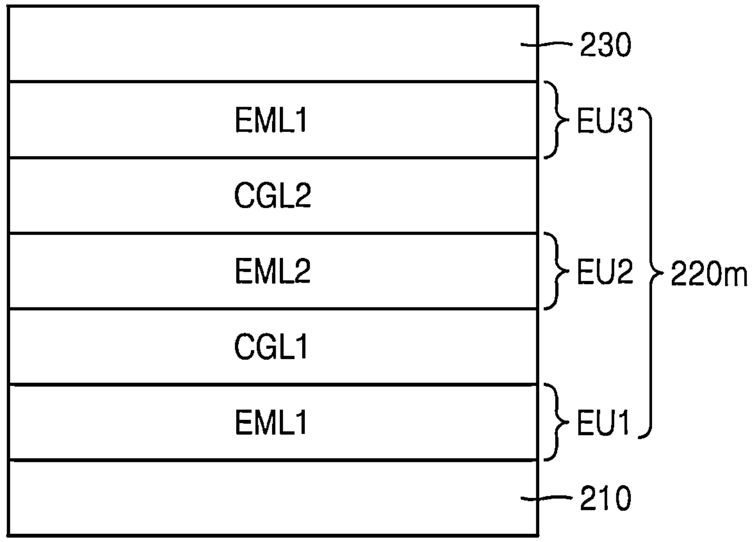
FIG. 19B is a cross-sectional view showing a structure of a display element, according to an embodiment.

In an embodiment, as illustrated in FIG. 19B, the organic light-emitting diode OLED may include the first emitting unit EU1 and a third emitting unit EU3 including the first emission layer EML1 and the second emitting unit EU2 including the second emission layer EML2. A first charge generation layer CGL1 may be provided between the first emitting unit EU1 and the second emitting unit EU2, and a second charge generation layer CGL2 may be provided between the second emitting unit EU2 and the third emitting unit EU3. For example, the organic light-emitting diode OLED may include the pixel electrode 210, the first emission layer EML1, the first charge generation layer CGL1, the second emission layer EML2, the second charge generation layer CGL2, the first emission layer EML1, and the opposite electrode 230 that are sequentially stacked. The first functional layer and the second functional layer may be included below and above the first emission layer EML1, respectively. The first functional layer and the second functional layer may be included below and above the second emission layer EML2, respectively. The first emission layer EML1 may be a blue emission layer, and the second emission layer EML2 may be a yellow emission layer.

In an embodiment, the organic light-emitting diode OLED may include the second emitting unit EU2 that may further include a third emission layer EML3 and/or a fourth emission layer EML4 directly contacting the second emission layer EML2 below and/or above the second emission layer EML2, in addition to the second emission layer EML2. Here, to directly contact may denote that no layer may be arranged between the second emission layer EML2 and the third emission layer EML3 and/or between the second emission layer EML2 and the fourth emission layer EML4. The third emission layer EML3 may be a red emission layer, and the fourth emission layer EML4 may be a green emission layer.

Figure 19C:
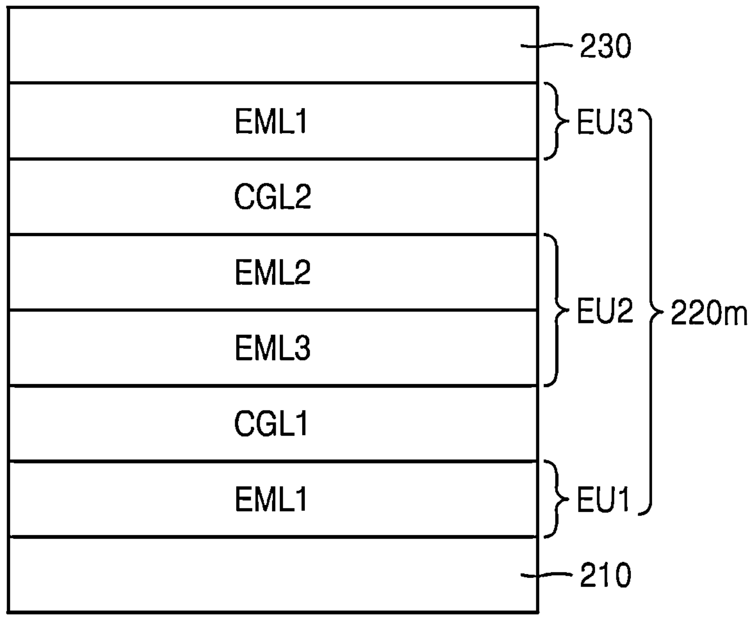
FIG. 19C is a cross-sectional view showing a structure of a display element, according to an embodiment.

In an embodiment and as illustrated in FIG. 19C, the organic light-emitting diode OLED may include the pixel electrode 210, the first emission layer EML1, the first charge generation layer CGL1, the third emission layer EML3, the second emission layer EML2, the second charge generation layer CGL2, the first emission layer EML1, and the opposite electrode 230 that are sequentially stacked. In another embodiment and as illustrated in FIG. 19D, the organic light-emitting diode OLED may include the pixel electrode 210, the first emission layer EML1, the first charge generation layer CGL1, the third emission layer EML3, the second emission layer EML2, the fourth emission layer EML4, the second charge generation layer CGL2, the first emission layer EML1, and the opposite electrode 230 that are sequentially stacked.

Figure 19D:
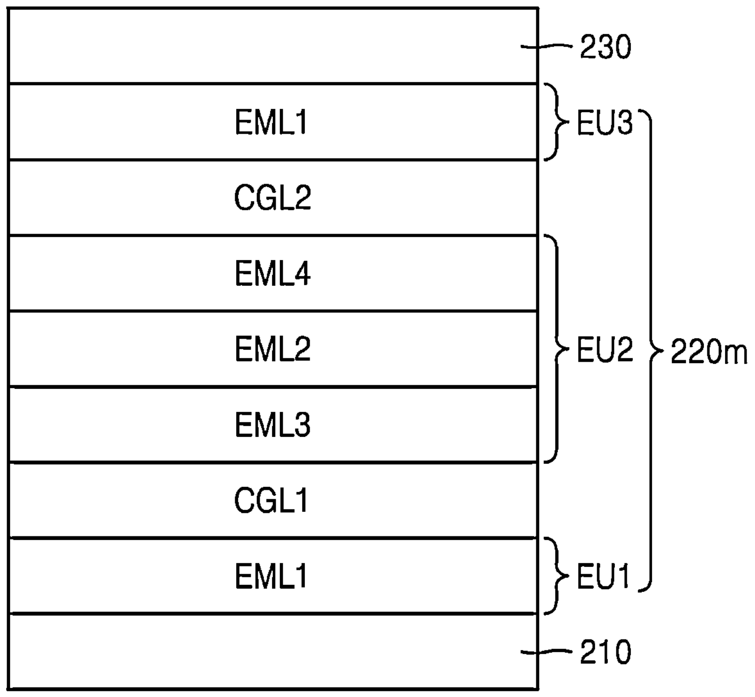
FIG. 19D is a cross-sectional view showing a structure of a display element, according to an embodiment.
Figure 20A:
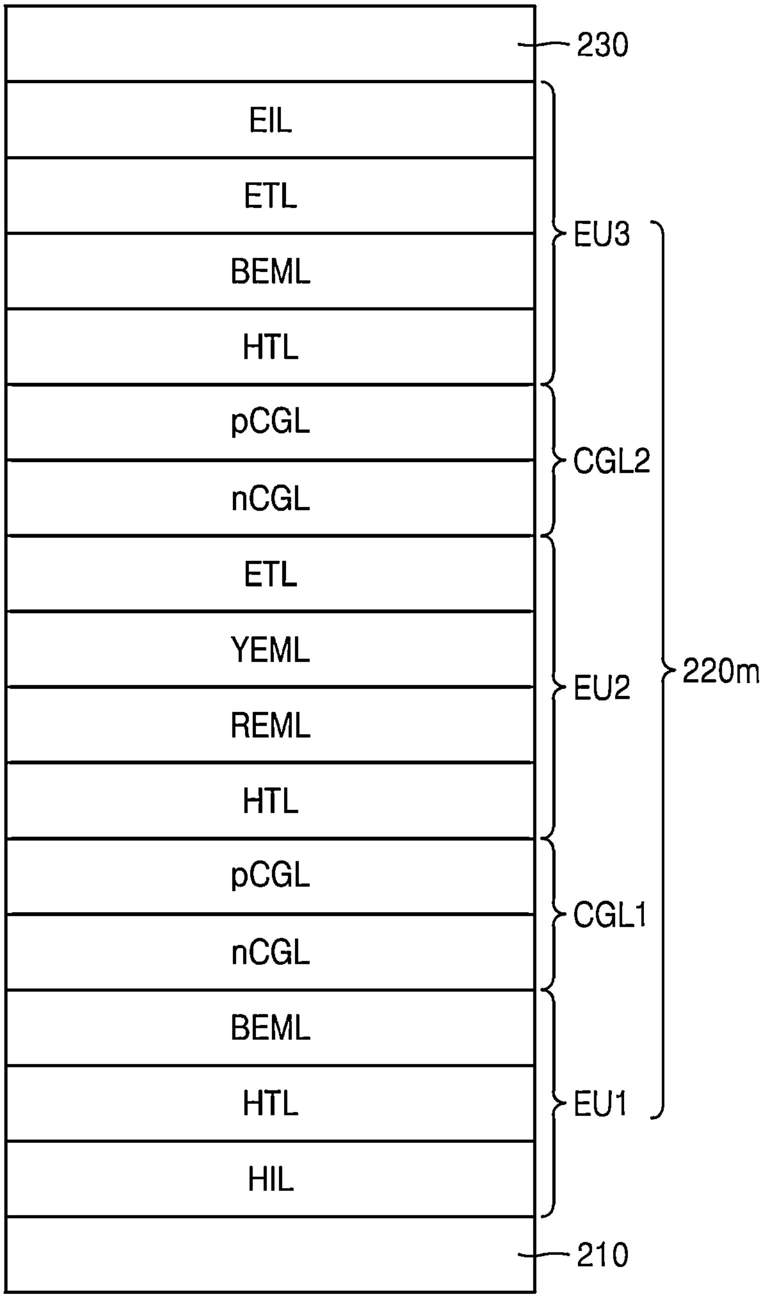
FIG. 20A is a cross-sectional view showing a structure of a display element, according to an embodiment.
Figure 20B:
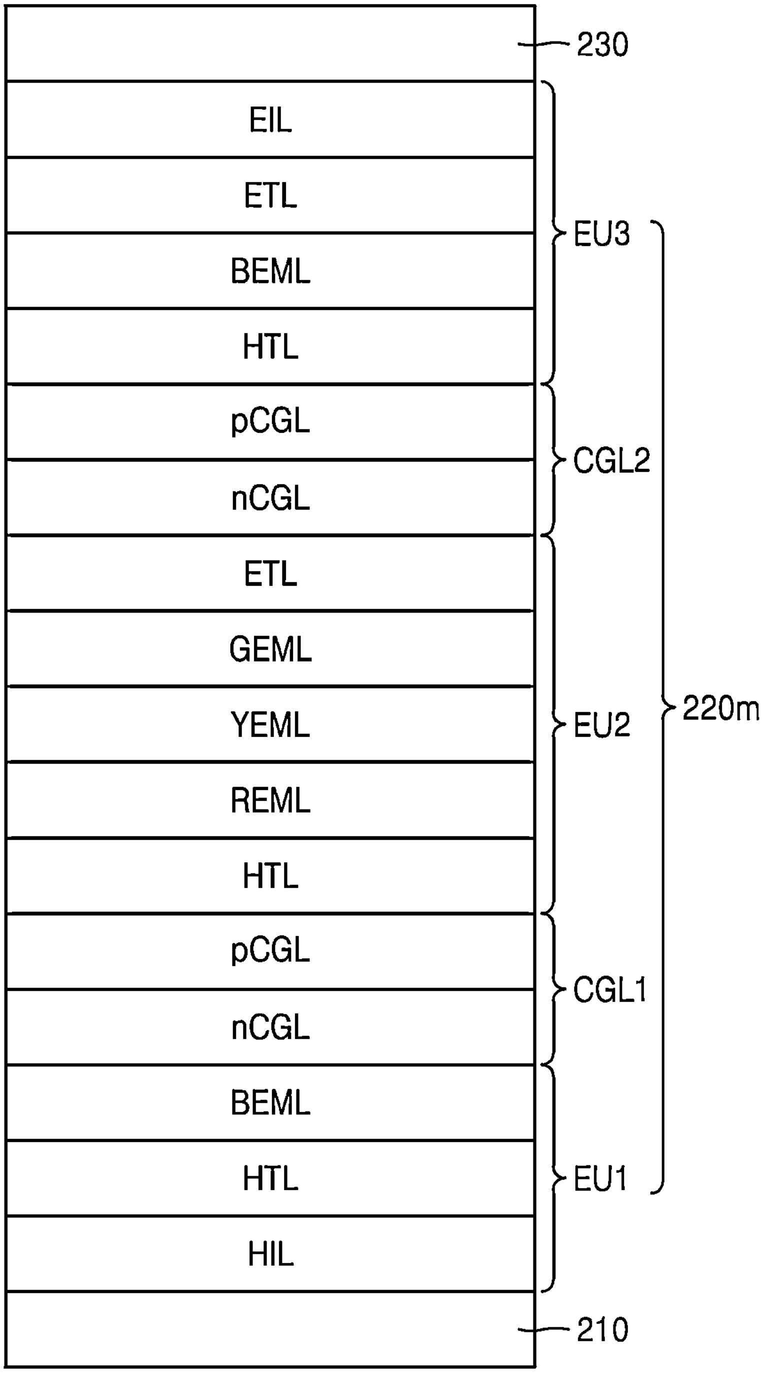
FIG. 20B is a cross-sectional view showing a structure of a display element, according to an embodiment.

FIG. 20A is a cross-sectional view showing an example of the organic light-emitting diode OLED of FIG. 19C, according to an embodiment, and FIG. 20B is a cross-sectional view showing an example of the organic light-emitting diode OLED of FIG. 19D, according to an embodiment.

In an embodiment and referring to FIG. 20A, the organic light-emitting diode OLED may include the first emitting unit EU1, the second emitting unit EU2, and the third emitting unit EU3 that are sequentially stacked. The first charge generation layer CGL1 may be provided between the first emitting unit EU1 and the second emitting unit EU2, and the second charge generation layer CGL2 may be provided between the second emitting unit EU2 and the third emitting unit EU3. Each of the first charge generation layer CGL1 and the second charge generation layer CGL2 may include a negative charge generation layer nCGL and a positive charge generation layer pCGL.

In an embodiment, the first emitting unit EU1 may include a blue emission layer BEML. The first emitting unit EU1 may further include a hole injection layer HIL and a hole transport layer HTL between the pixel electrode 210 and the blue emission layer BEML. In an embodiment, a p-doping layer may be further included between the hole injection layer HIL and the hole transport layer HTL. The p-doping layer may be formed by doping the hole injection layer HIL with a p-type doing material. In an embodiment, at least one of a blue light auxiliary layer, an electron block layer, and a buffer layer may be further included between the blue emission layer BEML and the hole transport layer HTL. The blue light auxiliary layer may increase the emission efficiency of the blue emission layer BEML. The blue light auxiliary layer may increase the emission efficiency of the blue emission layer BEML by adjusting a hole charge balance. The electron block layer may prevent the injection of electrons into the hole transport layer HTL. The buffer layer may compensate for a resonance distance according to a wavelength of the light emitted from the emission layer.

In an embodiment, the second emitting unit EU2 may include a yellow emission layer YEML and a red emission layer REML directly contacting the yellow emission layer YEML below the yellow emission layer YEML. The second emitting unit EU2 may further include a hole transport layer HTL between the positive charge generation layer pCGL of the first charge generation layer CGL1 and the red emission layer REML and may further include an electron transport layer ETL between the yellow emission layer YEML and the negative charge generation layer nCGL of the second charge generation layer CGL2.

In an embodiment, the third emitting unit EU3 may include the blue emission layer BEML. The third emitting unit EU3 may further include a hole transport layer HTL between the positive charge generation layer pCGL of the second charge generation layer CGL2 and the blue emission layer BEML. The third emitting unit EU3 may further include an electron transport layer ETL and an electron injection layer EIL between the blue emission layer BEML and the opposite electrode 230. The electron transport layer ETL may include a single layer or layers. In an embodiment, at least one of a blue light auxiliary layer, an electron block layer, and a buffer layer may be further included between the blue emission layer BEML and the hole transport layer HTL. At least one of a hole block layer and a buffer layer may be further included between the blue emission layer BEML and the electron transport layer ETL. The hole block layer may prevent the injection of holes into the electron transport layer ETL.

In an embodiment, the organic light-emitting diode OLED illustrated in FIG. 20B may have a different stack structure of the second emitting unit EU2 from the organic light-emitting diode OLED illustrated in FIG. 20A, and except for the stack structure of the second emitting unit EU2, may have the same structure as the organic light-emitting diode OLED illustrated in FIG. 20A. Referring to FIG. 20B, the second emitting unit EU2 may include the yellow emission layer YEML, the red emission layer REML directly contacting the yellow emission layer YEML below the yellow emission layer YEML, and a green emission layer GEML directly contacting the yellow emission layer YEML above the yellow emission layer YEML. The second emitting unit EU2 may further include a hole transport layer HTL between the positive charge generation layer pCGL of the first charge generation layer CGL1 and the red emission layer REML and may further include an electron transport layer ETL between the green emission layer GEML and the negative charge generation layer nCGL of the second charge generation layer CGL2.

Figure 21:
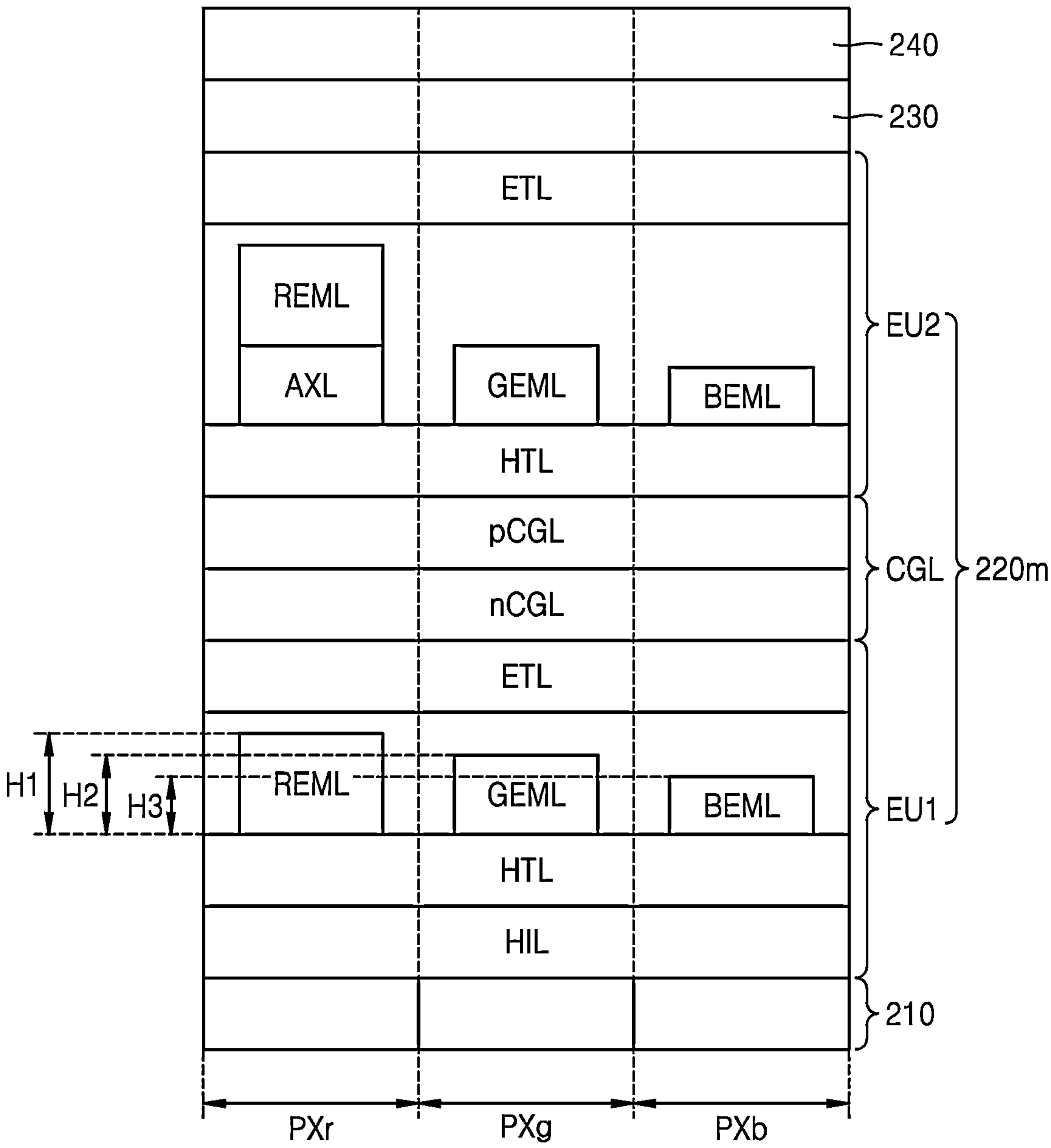
FIG. 21 is a cross-sectional view showing a structure of a pixel of a display apparatus, according to an embodiment.

FIG. 21 is a cross-sectional view showing a structure of a pixel of a display apparatus, according to an embodiment.

In an embodiment and referring to FIG. 21, the display apparatus may include a plurality of pixels. The plurality of pixels may include a first pixel PXr, a second pixel PXg, and a third pixel PXb. Each of the first to third pixels PXr to PXb, respectively, may include the pixel electrode 210, the opposite electrode 230, and the intermediate layer 220*m*. In an embodiment, the first pixel PXr may include a red pixel, the second pixel PXg may include a green pixel, and the third pixel PXb may include a blue pixel. Here, the pixel may include an organic light-emitting diode OLED as a display element, and the organic light-emitting diode OLED of each pixel may be electrically connected to a pixel circuit.

In an embodiment, the pixel electrode 210 may be separately provided in each of the first pixel PXr, the second pixel PXg, and the third pixel PXb.

In an embodiment, the intermediate layer 220*m* of the organic light-emitting diode OLED of each of the first through third pixels PXr through PXb, respectively, may include: a first emitting unit EU1 and a second emitting unit EU2 that are sequentially stacked; and a charge generation layer CGL disposed between the first emitting unit EU1 and the second emitting unit EU2. The charge generation layer CGL may include a negative charge generation layer nCGL and a positive charge generation layer pCGL. The charge generation layer CGL may be a common layer continually formed throughout the first through third pixels PXr through PXb, respectively.

In an embodiment, the first emitting unit EU1 of the first pixel PXr may include a hole injection layer HIL, a hole transport layer HTL, a red emission layer REML, and an electron transport layer ETL that are sequentially stacked on the pixel electrode 210. The first emitting unit EU1 of the second pixel PXg may include a hole injection layer HIL, a hole transport layer HTL, a green emission layer GEML, and an electron transport layer ETL that are sequentially stacked on the pixel electrode 210. The first emitting unit EU1 of the third pixel PXb may include a hole injection layer HIL, a hole transport layer HTL, a blue emission layer BEML, and an electron transport layer ETL that are sequentially stacked on the pixel electrode 210. Each of the hole injection layer HIL, the hole transport layer HTL, and the electron transport layer ETL of each of the first emitting units EU1 may be a common layer continually formed throughout the first through third pixels PXr through PXb, respectively.

In an embodiment, the second emitting unit EU2 of the first pixel PXr may include a hole transport layer HTL, an auxiliary layer AXL, a red emission layer REML, and an electron transport layer ETL that are sequentially stacked on the charge generation layer CGL. The second emitting unit EU2 of the second pixel PXg may include a hole transport layer HTL, a green emission layer GEML, and an electron transport layer ETL that are sequentially stacked on the charge generation layer CGL. The second emitting unit EU2 of the third pixel PXb may include a hole transport layer HTL, a blue emission layer BEML, and an electron transport layer ETL that are sequentially stacked on the charge generation layer CGL. Each of the hole transport layer HTL and the electron transport layer ETL of each of the second emitting units EU2 may be a common layer continually formed throughout the first through third pixels PXr through PXb, respectively. In an embodiment, in the second emitting units EU2 of the first through third pixels PXr through PXb, respectively, at least one of a hole block layer and a buffer layer may be further included between the emission layer and the electron transport layer ETL.

In an embodiment, a thickness H1 of the red emission layer REML, a thickness H2 of the green emission layer GEML, and a thickness H3 of the blue emission layer BEML may be determined according to a resonance distance. The auxiliary layer AXL may be an area added to adjust the resonance distance and may include a resonance auxiliary material. For example, the auxiliary layer AXL may include the same material as the hole transport layer HTL.

In an embodiment, FIG. 21 illustrates that the auxiliary layer AXL may be included in only the first sub-pixel PXr. However, the invention is not limited thereto. For example, the auxiliary layer AXL may be provided in at least one of the first through third pixels PXr through PXb, respectively, to adjust the resonance distance of the at least one of the first through third pixels PXr through PXb, respectively.

In an embodiment, the display apparatus may further include a capping layer 240 arranged outside the opposite electrode 230. The capping layer 240 may increase emission efficiency based on a constructive interference principle. Therefore, because the light extraction efficiency of the organic light-emitting diode OLED is increased, the emission efficiency of the organic light-emitting diode OLED may be increased.

As described above, according to one or more of the above embodiments, a display apparatus having improved display quality may be provided. However, the scope of the invention is not limited to the embodiments disclosed herein.

It should be understood that embodiments described herein should be considered in a descriptive sense only and not for purposes of limitation. Descriptions of features or aspects within each embodiment should typically be considered as available for other similar features or aspects in other embodiments. While one or more embodiments have been described with reference to the figures, it will be understood by those of ordinary skill in the art that various changes in form and details may be made therein without departing from the spirit and scope of the invention. Moreover, the embodiments or parts of the embodiments may be combined in whole or in part without departing from the scope of the invention.

What is claimed is:

1. A display apparatus including pixels arranged in a display area, the display apparatus comprising:

a first conductive layer including a first voltage line;

a second conductive layer disposed on the first conductive layer and including a first conductive pattern overlapping the first voltage line;

a semiconductor layer disposed on the second conductive layer and including a first semiconductor pattern overlapping the first conductive pattern;

a third conductive layer disposed on the semiconductor layer and including a second conductive pattern overlapping the first conductive pattern; and a fourth conductive layer disposed on the third conductive layer and including a data line and a third conductive pattern overlapping the second conductive pattern, wherein the first voltage line includes a body portion extending in a first direction and a shielding portion extending from the body portion in a second direction to overlap the data line, wherein the second direction crosses the first direction, and wherein the first conductive pattern is between the first voltage line and the first semiconductor pattern in a cross-sectional view.

2. The display apparatus of claim 1, wherein the third conductive layer further includes a first connection electrode, and wherein the fourth conductive layer further includes a second connection electrode, wherein the shielding portion is electrically connected to the first semiconductor pattern via the first connection electrode and the second connection electrode.

3. The display apparatus of claim 1, wherein the shielding portion is spaced apart from the first semiconductor pattern in a plan view.

4. The display apparatus of claim 1, wherein the first conductive layer further includes a fourth conductive pattern overlapping the second conductive pattern, wherein the second conductive pattern is electrically connected to the fourth conductive pattern, and wherein the first conductive pattern is electrically connected to the third conductive pattern.

5. The display apparatus of claim 1, wherein the data line includes a first data line, a second data line, and a third data line, and wherein the shielding portion includes a first shielding portion overlapping the first data line, a second shielding portion overlapping the second data line, and a third shielding portion overlapping the third data line, wherein the first shielding portion, the second shielding portion, and the third shielding portion have a same area.

6. The display apparatus of claim 1, wherein the data line includes a first data line, a second data line, and a third data line, and wherein the shielding portion includes a first shielding portion overlapping the first data line, a second shielding portion overlapping the second data line, and a third shielding portion overlapping the third data line, wherein an area of the first shielding portion is different from an area of the second shielding portion and an area of the third shielding portion.

7. The display apparatus of claim 6, wherein the pixels include a red pixel that emits red light, a blue pixel that emits blue light, and a green pixel that emits green light, wherein the first data line is electrically connected to the red pixel.

8. The display apparatus of claim 1, wherein the first conductive layer further includes a second voltage line extending in the first direction, and wherein the semiconductor layer further includes a second semiconductor pattern electrically connected between the data line and the second voltage line.

9. The display apparatus of claim 8, wherein the third conductive layer further includes a first gate line overlapping the first semiconductor pattern and configured to transmit a first gate signal, and a second gate line overlapping the second semiconductor pattern and configured to transmit a second gate signal, and wherein the pixel operates in a non-emission period and an emission period during one frame period, wherein, in the non-emission period, after the second gate signal changes to an on-voltage, the first gate signal changes to an on-voltage, and after the second gate signal changes to an off-voltage, the first gate signal changes to an off-voltage.

10. The display apparatus of claim 9, wherein during an on-voltage period of the second gate signal, a reference voltage is transmitted through the second voltage line to the second conductive pattern.

11. The display apparatus of claim 1, further comprising a fifth conductive layer disposed on the fourth conductive layer and including a third voltage line extending in the second direction and overlapping the data line.

12. The display apparatus of claim 11, further comprising a voltage supply line disposed in a peripheral area outside the display area and extending in the first direction, wherein the third voltage line crosses the display area and is connected to the voltage supply line in the peripheral area.

13. The display apparatus of claim 12, wherein the pixel includes a display element including a pixel electrode, an opposite electrode, and an intermediate layer disposed between the pixel electrode and the opposite electrode, wherein a voltage supplied to the third voltage line is equal to a voltage supplied to the opposite electrode.

14. The display apparatus of claim 12, wherein the pixel includes a display element including a pixel electrode, an opposite electrode, and an intermediate layer disposed between the pixel electrode and the opposite electrode, wherein a voltage supplied to the third voltage line is different than a voltage supplied to the opposite electrode.

15. The display apparatus of claim 1, further comprising:

a fifth conductive layer disposed on the fourth conductive layer and including a fourth voltage line extending in the second direction; and a sixth conductive layer disposed on the fifth conductive layer and including pixel electrodes, auxiliary electrodes, and fifth voltage lines extending in the first direction and connecting neighboring auxiliary electrodes among the auxiliary electrodes.

16. The display apparatus of claim 15, further comprising a pixel-defining layer disposed on the sixth conductive layer and defining pixel openings and auxiliary openings, wherein each of the pixel openings overlaps one of the pixel electrodes, and each of the auxiliary openings overlaps one of the auxiliary electrodes, which overlap the fourth voltage line.

* * * * *